United States Patent
Suzuki et al.

(10) Patent No.: US 8,435,720 B2
(45) Date of Patent: May 7, 2013

(54) LITHOGRAPHIC PRINTING PLATE PRECURSOR AND PLATE MAKING METHOD THEREOF

(75) Inventors: Shota Suzuki, Shizuoka (JP); Yuriko Ishiguro, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/406,095

(22) Filed: Feb. 27, 2012

(65) Prior Publication Data

US 2012/0219911 A1  Aug. 30, 2012

(30) Foreign Application Priority Data

Feb. 28, 2011  (JP) ................................. 2011-043397
Jan. 31, 2012  (JP) ................................. 2012-019100

(51) Int. Cl.
| | |
|---|---|
| B41N 1/14 | (2006.01) |
| G03F 7/09 | (2006.01) |
| G03F 7/20 | (2006.01) |
| G03F 7/038 | (2006.01) |
| G03F 7/11 | (2006.01) |
| B41C 1/10 | (2006.01) |

(52) U.S. Cl.
USPC ............. 430/273.1; 430/272.1; 430/944; 430/302; 430/281.1

(58) Field of Classification Search ............. None
See application file for complete search history.

(56) References Cited

U.S. PATENT DOCUMENTS

| | | | |
|---|---|---|---|
| 2001/0018159 A1 | 8/2001 | Maemoto | |
| 2002/0177074 A1 | 11/2002 | Hoshi et al. | |
| 2005/0069811 A1 | 3/2005 | Mitsumoto et al. | |
| 2012/0052442 A1* | 3/2012 | Suzuki et al. ............. | 430/271.1 |

FOREIGN PATENT DOCUMENTS

| | | |
|---|---|---|
| EP | 1 739 486 A1 | 1/2007 |
| JP | 2001-277740 A | 10/2001 |
| JP | 2001-277742 A | 10/2001 |
| JP | 2002-287334 A | 10/2002 |
| JP | 2005-119273 A | 5/2005 |
| JP | 2008-162056 A | 7/2008 |
| JP | 4162365 B2 | 10/2008 |

OTHER PUBLICATIONS

Extended European Search Report issued in European Patent Application No. 12157267.1 on May 4, 2012.

* cited by examiner

*Primary Examiner* — Cynthia Hamilton
(74) *Attorney, Agent, or Firm* — Birch, Stewart, Kolasch & Birch, LLP.

(57) ABSTRACT

A lithographic printing plate precursor includes, in the following order: a support; an image-recording layer which is capable of forming an image by removing an unexposed area of the image-recording layer with at least one of printing ink and dampening water on a printing machine after exposure and contains an infrared absorbing dye, a polymerization initiator, a polymerizable compound and a binder polymer having an alkylene oxide group; and a protective layer containing a hydrophilic polymer which contains at least a repeating unit represented by the formula (1) as defined herein, a repeating unit represented by the formula (2) as defined herein, and a repeating unit represented by the formula (4) as defined herein, and in which a content of the repeating unit represented by the formula (4) is from 0.3 to 5.0% by mole based on total repeating units of the hydrophilic polymer.

11 Claims, No Drawings

LITHOGRAPHIC PRINTING PLATE PRECURSOR AND PLATE MAKING METHOD THEREOF

FIELD OF THE INVENTION

The present invention relates to a lithographic printing plate precursor and a plate making method thereof. More particularly, it relates to a lithographic printing plate precursor capable of undergoing a direct plate making by image exposure with laser and capable of undergoing on-press development and a plate making method including on-press development.

BACKGROUND OF THE INVENTION

In general, a lithographic printing plate is composed of an oleophilic image area accepting ink and a hydrophilic non-image area accepting dampening water in the process of printing. Lithographic printing is a printing method utilizing the nature of water and oily ink to repel with each other and comprising rendering the oleophilic image area of the lithographic printing plate to an ink-receptive area and the hydrophilic non-image area thereof to a dampening water-receptive area (ink-unreceptive area), thereby making a difference in adherence of the ink on the surface of the lithographic printing plate, depositing the ink only to the image area, and then transferring the ink to a printing material, for example, paper.

In order to produce the lithographic printing plate, a lithographic printing plate precursor (PS plate) comprising a hydrophilic support having provided thereon an oleophilic photosensitive resin layer (image-recording layer) is used. Specifically, the PS plate is exposed through a mask, for example, a lith film, and then subjected to development processing, for example, with an alkaline developer to remove the unnecessary image-recording layer corresponding to the non-image area by dissolving while leaving the image-recording layer corresponding to the image area, thereby obtaining the lithographic printing plate.

Due to the recent progress in the technical field, nowadays the lithographic printing plate can be obtained by a CTP (computer-to-plate) technology. Specifically, a lithographic printing plate precursor is directly subjected to scanning exposure using laser or laser diode without using a lith film and developed to obtain a lithographic printing plate.

With the progress described above, the issue on the lithographic printing plate precursor has transferred to improvements, for example, in image-forming property corresponding to the CTP technology, printing property or physical property. Also, with the increasing concern about global environment, as another issue on the lithographic printing plate precursor, an environmental problem on waste liquid discharged accompanying the wet treatment, for example, development processing comes to the front.

In response to the environmental problem, simplification of development or plate making or non-processing has been pursued. As one method of simple plate making, a method referred to as "on-press development" is practiced. Specifically, according to the method after exposure of a lithographic printing plate precursor, the lithographic printing plate precursor is mounted as it is on a printing machine without conducting conventional development and removal of the unnecessary area of image-recording layer is performed at an early stage of printing step.

Also, as a method of simple development, a method referred to as "gum development" is practiced wherein the removal of the unnecessary area of image-recording layer is performed using not a conventional high alkaline developer but a finisher or gum solution of near-neutral pH.

In the simplification of plate making operation as described above, a system using a lithographic printing plate precursor capable of being handled in a bright room or under a yellow lump and a light source is preferred from the standpoint of workability. Thus, as the light source, a semiconductor laser emitting an infrared ray having a wavelength from 760 to 1,200 or a solid laser, for example, YAG laser, is used. An UV laser is also used.

As the lithographic printing plate precursor capable of undergoing on-press development, for instance, a lithographic printing plate precursor having provided on a hydrophilic support, an image-recording layer (heat-sensitive layer) containing microcapsules having a polymerizable compound encapsulated therein is described in JP-A-2001-277740 (the term "JP-A" as used herein means an "unexamined published Japanese patent application") and JP-A-2001-277742. A lithographic printing plate precursor having provided on a support, an image-recording layer (photosensitive layer) containing an infrared absorbing agent, a radical polymerization initiator and a polymerizable compound is described in JP-A-2002-287334.

It is proposed to incorporate a cellulose into a protective layer (overcoat layer) in order to impart ink receptivity in Japanese Patent 4162365 or JP-A-2008-162056. However, the technique is insufficient in view of balance between the ink receptivity or printing durability and the on-press development property.

Further, a lithographic printing plate precursor having provided on a support, an image-recording layer capable of being removed with either printing ink, dampening water or both of them containing an actinic radiation absorber, a polymerization initiator and a polymerizable compound and a protective layer containing an inorganic stratiform compound in this order is described in JP-A-2005-119273.

However, the technique has a problem in that a polyvinyl alcohol resin and an inorganic stratiform compound which has a hydrophilic surface get into the image-recording layer during the coating and drying stages and the image-recording layer is cured as it is by exposure to from the image area so that the ink receptivity is deteriorated at the initiation of printing and on the way of printing.

SUMMARY OF THE INVENTION

An object of the present invention is to provide a lithographic printing plate precursor which overcomes the problems in the prior art described above and a plate making method of the lithographic printing plate precursor. Specifically, it is to provide a lithographic printing plate which has good ink receptivity and exhibits high printing durability and to provide a lithographic printing plate precursor which has good on-press development property and a plate making method of the lithographic printing plate precursor.

The present invention includes the following items.

1. A lithographic printing plate precursor comprising, in the following order, a support having thereon an image-recording layer which is capable of forming an image by removing an unexposed area of the image-recording layer with at least one of printing ink and dampening water on a printing machine after exposure and contains (A) an infrared absorbing dye, (B) a polymerization initiator, (C) a polymerizable compound and (D) a binder polymer having an alkylene oxide group and a protective layer containing (E) a hydrophilic polymer which contains at least a repeating unit represented by formula (1), a repeating unit represented by formula (2) and a repeating unit represented by formula (4) and in which a content of the repeating unit represented by formula (4) is from 0.3 to 5.0% by mole based on total repeating units of the hydrophilic polymer:

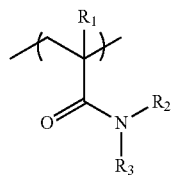

Formula (1)

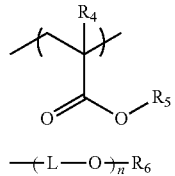

Formula (2)

Formula (3)

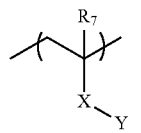

Formula (4)

Structural Group (5)

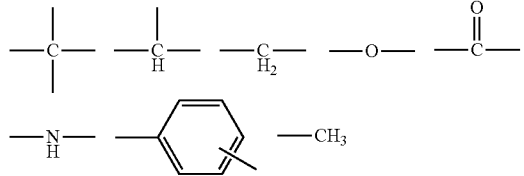

In formulae (1), (2) and (4), $R_1$, $R_4$ and $R_7$ each independently represents a hydrogen atom or a methyl group, $R_2$ and $R_3$, which may be the same or different, each represents a hydrogen atom, a methyl group or an ethyl group, and $R_5$ represents an alkyl group having from 2 to 10 carbon atoms.

In formula (4), X represents a single bond, a divalent connecting chain selected from structures of Structural Group (5) or a divalent connecting chain formed by a combination of two ore more structures of Structural Group (5), and Y represents a carboxylic acid group, a carboxylate group, a sulfonic acid group, a sulfonate group, a phosphoric acid group, a phosphate group, a phosphoric acid group, a phosphonate group, a hydroxy group, a carboxybetaine group, a sulfobetaine group, an ammonium group or a polyether group represented by formula (3).

In formula (3), L represents an alkylene group having from 2 to 6 carbon atoms, $R_6$ represents an alkyl group having from 4 to 8 carbon atoms, and n means an average addition molar number of polyether and represents a number from 2 to 4.

(2) The lithographic printing plate precursor as described in (1) above, wherein $R_2$ and $R_3$ in the repeating unit represented by formula (1) are hydrogen atoms and $R_5$ in the repeating unit represented by formula (2) is an unsubstituted straight-chain, branched or cyclic alkyl group having from 2 to 8 carbon atoms.

(3) The lithographic printing plate precursor as described in (1) or (2) above, wherein Y in formula (4) represents a sulfonic acid group, a sulfonate group, a carboxybetaine group, a sulfobetaine group or an ammonium group.

(4) The lithographic printing plate precursor as described in any one of (1) to (3) above, wherein X in formula (4) contains one of the following connecting chains.

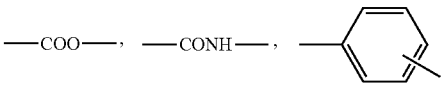

(5) The lithographic printing plate precursor as described in any one of (1) to (4) above, wherein the protective layer contains (F) an inorganic stratiform compound.

(6) The lithographic printing plate precursor as described in any one of (1) to (5) above, wherein the image-recording layer further contains (G) a hydrophobilizing precursor.

(7) A plate making method of a lithographic printing plate precursor comprising exposing imagewise the lithographic printing plate precursor as described in any one of (1) to (6) above and then removing an unexposed area of the image-recording layer by supplying at least one of printing ink and dampening water on a printing machine.

According to the present invention, the object of providing a lithographic printing plate which has good ink receptivity and exhibits high printing durability and providing a lithographic printing plate precursor which has good on-press development property can be achieved by incorporating (D) the binder polymer having an alkylene oxide group into the image-recording layer and incorporating (E) the hydrophilic polymer containing repeating units having the specific structures into the protective layer.

The functional mechanism of the invention is not quite clear but it is estimated as follows.

Heretofore, when (D) the binder polymer having an alkylene oxide group is incorporated into an image-recording layer in order to impart on-press development property, a problem arises in that a hydrophilic polymer and/or (F) the inorganic stratiform compound in a protective layer undergo interlayer mixing with the component of the image-recording layer at the time of drying of the protective layer and remain in the image area after development to cause degradation of ink receptivity.

In case of using a conventional hydrophilic binder polymer which ensures water solubility by including an acid group or a salt thereof in its molecule, hydrophilicity increases in the image-recording layer and protective layer so that the compatibility between ink receptivity and development property becomes difficult. In particular, as for a lithographic printing plate precursor of on-press development type having a protective layer containing an inorganic stratiform compound, increase in the ink receptivity is more difficult.

On the contrary, when (E) the hydrophilic polymer according to the invention in which a hydrophilic component represented by formula (1), a hydrophobic component represented by formula (2) that it self has an extremely low water solubility to such an extent that the water solubility is maintained, and a hydrophilic component having a specific structure represented by formula (4) in a small amount are copolymerized is used in a protective layer, the ink receptivity is good even when (D) the binder polymer having an alkylene oxide group is incorporated into an image-recording layer.

It is estimated that this is because (E) the hydrophilic polymer according to the invention inhibits mixing the component of the protective layer with the component of the image-recording layer even in the case where the protective layer contains (F) the inorganic stratiform compound so that the component of the protective layer can be rapidly removed at the on-press development.

According to the invention, it is extremely important that the amount of the hydrophilic component having a specific structure represented by formula (4) introduced to the hydrophilic polymer is small. When the amount thereof introduced is too large, the ink receptivity deteriorated. However, by introducing a small amount of the component represented by formula (4) into a hydrophilic polymer composed of a repeating unit represented by formula (1) and a repeating unit represented by formula (2), an unexpected result was obtained in that while maintaining good ink receptivity, the on-press development property was more improved in comparison with the hydrophilic polymer composed of a repeating unit represented by formula (1) and a repeating unit represented by formula (2).

Also, deterioration of the ink receptivity in case of using a specific color ink which tends to occur with a lithographic printing plate precursor after preservation did not occur at all.

As described above, the present invention is a technique relating to a novel polymer for protective layer of a lithographic printing plate precursor of on-press development type which is not expected from the prior art and makes the remarkable improvement in practical performance possible.

According to the present invention, a lithographic printing plate which has good ink receptivity and exhibits high printing durability can be provided, and a lithographic printing plate precursor which has good on-press development property can be provided.

DETAILED DESCRIPTION OF THE INVENTION

The present invention will be described in detail below.

[Lithographic Printing Plate Precursor]

The lithographic printing plate precursor according to the invention comprises a support having thereon an image-recording layer which is capable of forming an image by removing an unexposed area with at least any of printing ink and dampening water on a printing machine and a protective layer in this order. Further, the lithographic printing plate precursor according to the invention may have an undercoat layer between the support and the image-recording layer.

Hereinafter, the constituting elements, components and the likes of the lithographic printing plate precursor according to the invention will be described.

(Protective Layer)

The protective layer according to the invention is characterized by containing a hydrophilic polymer (hereinafter also referred to as a hydrophilic polymer according to the invention) containing at least a repeating unit represented by formula (1) shown below, a repeating unit represented by formula (2) shown below and a repeating unit represented by formula (4) shown below.

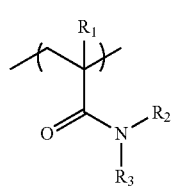

Formula (1)

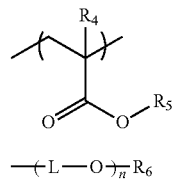

Formula (2)

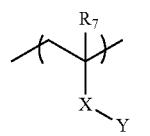

Formula (3)

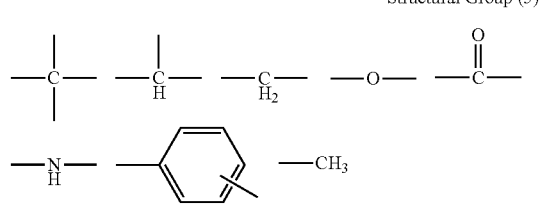

Formula (4)

Structural Group (5)

In formulae (1), (2) and (4), $R_1$, $R_4$ and $R_7$ each independently represents a hydrogen atom or a methyl group, $R_2$ and $R_3$, which may be the same or different, each represents a hydrogen atom, a methyl group or an ethyl group, and $R_5$ represents an alkyl group having from 2 to 10 carbon atoms. The alkyl group may be any of straight-chain, branched and cyclic alkyl groups and may have a substituent. As the substituent, an aromatic ring group, a heterocyclic group or a polyether group is exemplified.

In formula (4), X represents a single bond, a divalent connecting chain selected from structures of Structural Group (5) or a divalent connecting chain formed by a combination of two or more structures of Structural Group (5), and Y represents a carboxylic acid group, a carboxylate group, a sulfonic acid group, a sulfonate group, a phosphoric acid group, a phosphate group, a phosphoric acid group, a phosphonate group, a hydroxy group, a carboxybetaine group, a sulfobetaine group, an ammonium group or a polyether group represented by formula (3).

In formula (3), L represents an alkylene group having from 2 to 6 carbon atoms, and $R_6$ represents an alkyl group having from 4 to 8 carbon atoms. The alkyl group may be any of straight-chain, branched and cyclic alkyl groups and may have a substituent. As the substituent, an aromatic ring group is exemplified. n means an average addition molar number of polyether and represents a number from 2 to 4.

In the repeating unit represented by formula (1), $R_2$ and $R_3$ each preferably represents a hydrogen atom. In the repeating unit represented by formula (2), $R_5$ preferably represents an unsubstituted straight-chain, branched or cyclic alkyl group having from 2 to 8 carbon atoms.

Of the combinations of the repeating units represented by formulae (1) and (2) respectively, a combination where $R_1$ and $R_4$ in formulae (1) and (2) are both hydrogen atoms, $R_2$ and $R_3$ in formula (1) are both hydrogen atoms, and $R_5$ in formula (2) is an unsubstituted branched alkyl group having 4 carbon atoms is most preferred.

In the repeating unit represented by formula (4), from the standpoint of water solubility and on-press development property, Y is preferably a sulfonic acid group, a sulfonate group, a carboxybetaine group, a sulfobetaine group or an ammonium group, and more preferably a sulfonic acid group, a sulfonate group or a sulfobetaine group. X preferably contains one of connecting chains shown below.

Specific examples of a monomer from which the repeating unit represented by formula (1) is derived include acrylamide, methacrylamide, N-methylacrylamide, N-methylmethacrylamide, N-ethylacrylamide, N-ethylmethacrylamide, N,N-dimethylacrylamide, N,N-dimethylmethacrylamide, N,N-diethylacrylamide, N,N-diethylmethacrylamide, N,N-ethylmethylacrylamide and N,N-ethylmethylmethacrylamide.

Specific examples of a monomer from which the repeating unit represented by formula (2) is derived include methyl acrylate, ethyl acrylate, propyl acrylate, isopropyl acrylate, n-butyl acrylate, isobutyl acrylate, tert-butyl acrylate, pentyl acrylate, hexyl acrylate, cyclohexyl acrylate, heptyl acrylate, octyl acrylate, 2-ethylhexyl acrylate, nonyl acrylate, decyl acrylate, methyl methacrylate, ethyl methacrylate, propyl methacrylate, isopropyl methacrylate, n-butyl methacrylate, isobutyl methacrylate, tert-butyl methacrylate, pentyl methacrylate, hexyl methacrylate, cyclohexyl methacrylate, heptyl methacrylate, octyl methacrylate, 2-ethylhexyl methacrylate, nonyl methacrylate and decyl methacrylate.

Specific examples of a monomer from which the repeating unit represented by formula (4) is derived include 2-acryloylamino-2-methylpropanesulfonic acid, sodium 2-acryloylamino-2-methylpropanesulfonate, potassium 2-acryloylamino-2-methylpropanesulfonate, 4-((3-methacrylamidopropyl)dimethylammonio)butane-1-sulfonate, 4-((3-acrylamidopropyl)dimethylammonio)butane-1-sulfonate, vinyl alcohol, acrylic acid, methacrylic acid, sodium styrenesulfonate, diethylene glycol monomethyl ether methacrylate, hydroxyethyl acrylate, hydroxyethyl methacrylate, methacrylcholine chloride, potassium 3-sulfopropyl methacrylate, 2-(methacryloyloxy)ethyl phosphate, dimethyl-N-methacryloyloxyethyl-N-carboxymethylammonium betaine and vinylphosphonic acid.

The content of the repeating unit represented by formula (4) in the hydrophilic polymer (E) according to the invention is from 0.3 to 5% by mole. The content is preferably from 0.3 to 3% by mole, and more preferably from 0.3 to 1.5% by mole. In the range described above, good on-press development property, ink receptivity and printing durability are obtained. When the content is less than 0.3% by mole, the improvement in the on-press development property is not obtained, whereas when the content exceeds 3% by mole, the ink receptivity, particularly, the ink receptivity in case of using a specific color ink deteriorates.

The content of the repeating unit represented by formula (1) in the hydrophilic polymer is preferably from 65 to 96.7% by mole, more preferably from 70 to 80% by mole, and particularly preferably from 74 to 80% by mole. The content of the repeating unit represented by formula (2) in the hydrophilic polymer is preferably from 3 to 30% by mole, more preferably from 20 to 30% by mole, and particularly preferably from 20 to 26% by mole.

The weight average molecular weight (Mw) of the hydrophilic polymer (E) is preferably from 10,000 to 200,000, more preferably from 10,000 to 100,000, and most preferably from 10,000 to 30,000.

Specific examples of the hydrophilic polymer (E) are set forth below. The ratio x, y and z (in % by mole) of the respective repeating units and Mw of the hydrophilic polymer (E) are shown in Table 1.

The content of the hydrophilic polymer (E) according to the invention in the protective layer is preferably 40% by weight or more, more preferably 60% by weight or more, particularly preferably 80% by weight or more, based on the solid content of the protective layer. In the range described above, the lithographic printing plate exhibits better ink receptivity and better printing durability and the lithographic printing plate precursor exhibits better on-press development property is obtained.

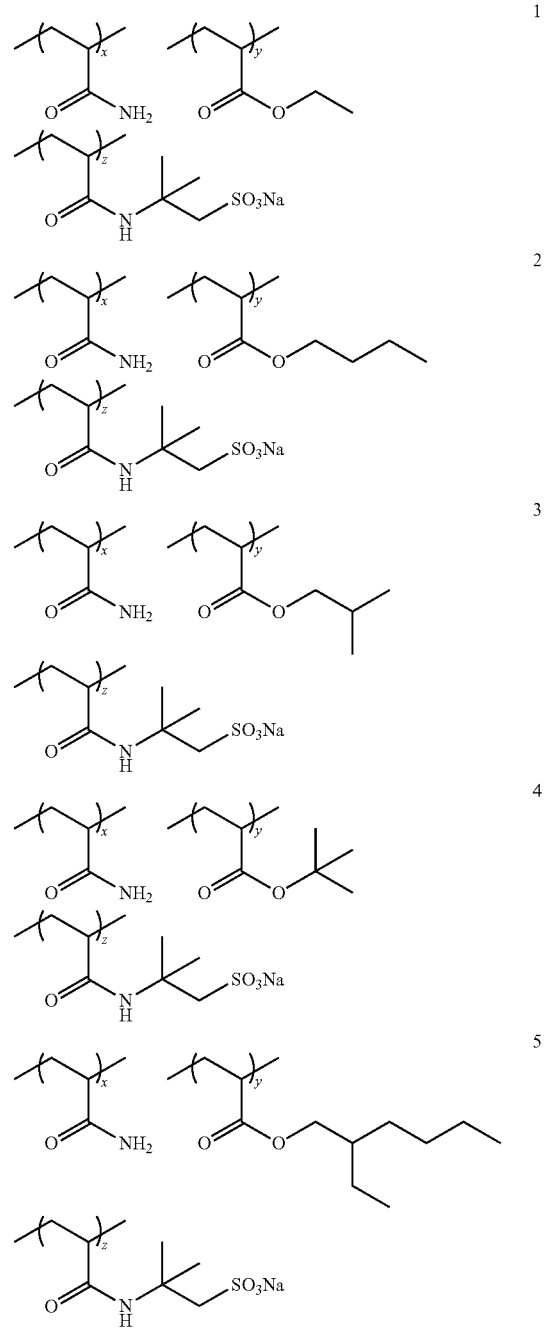

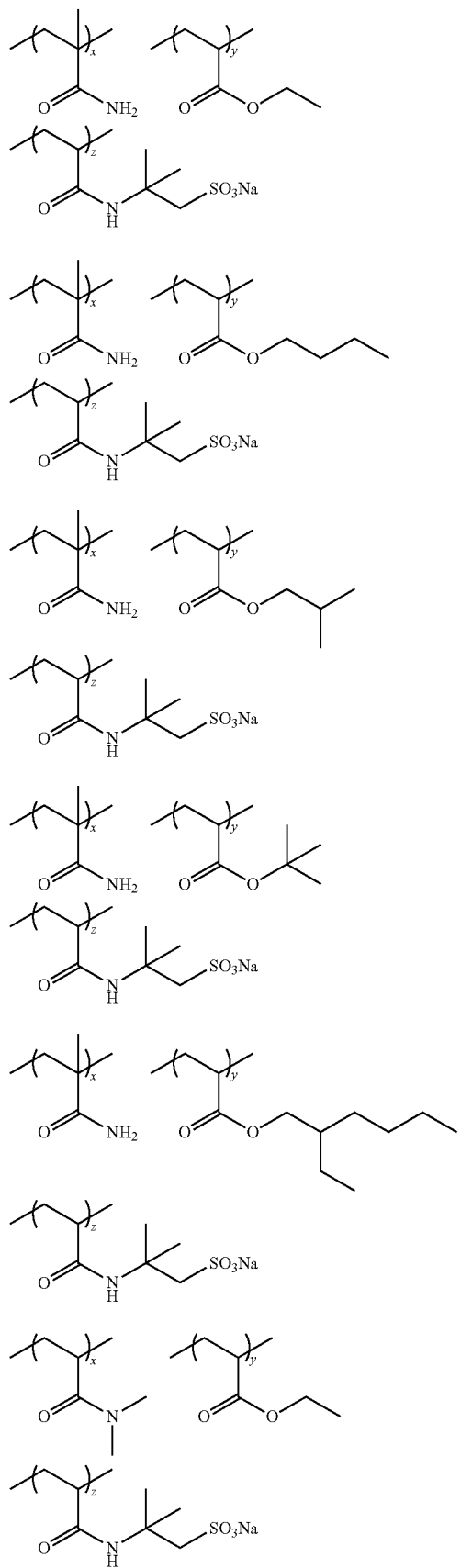
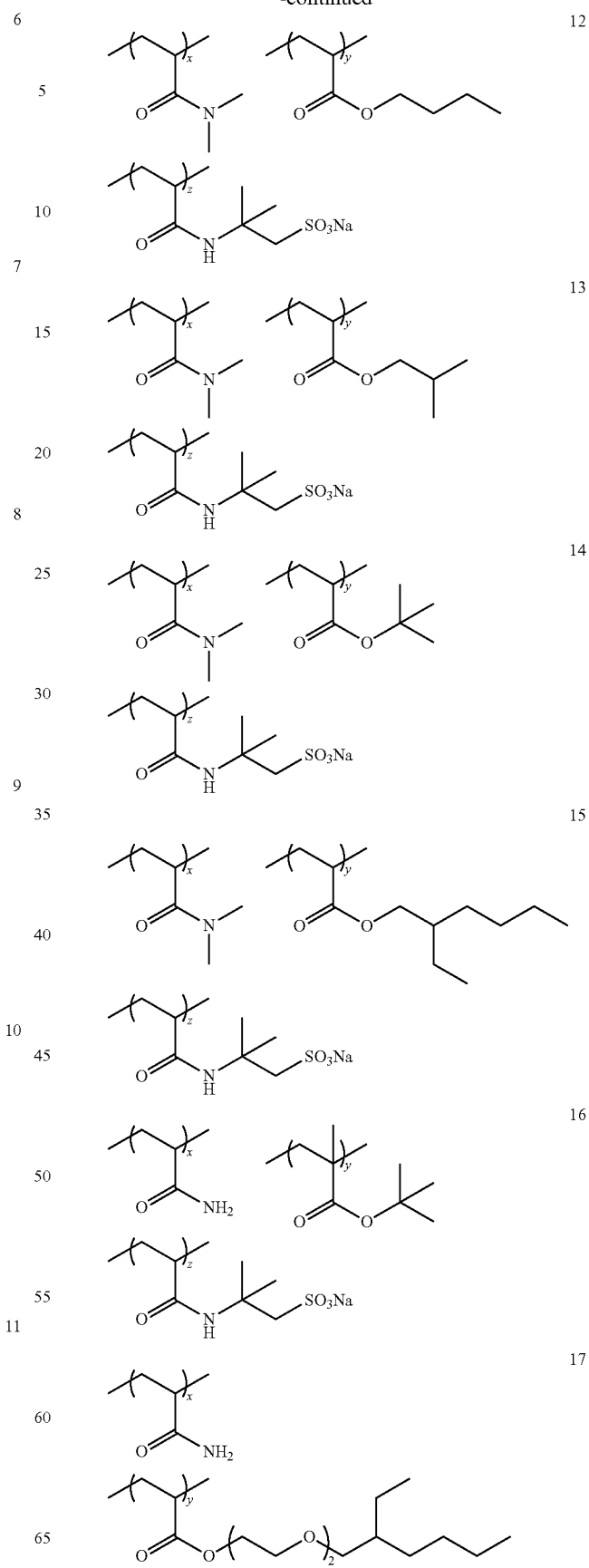

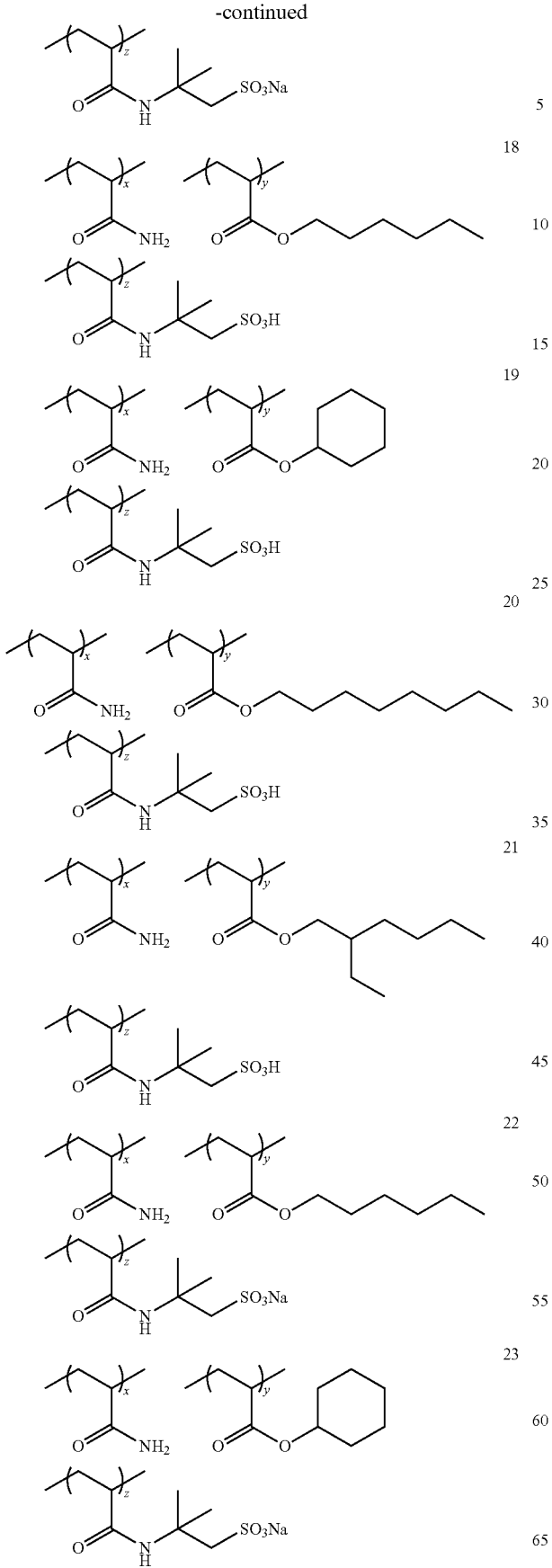
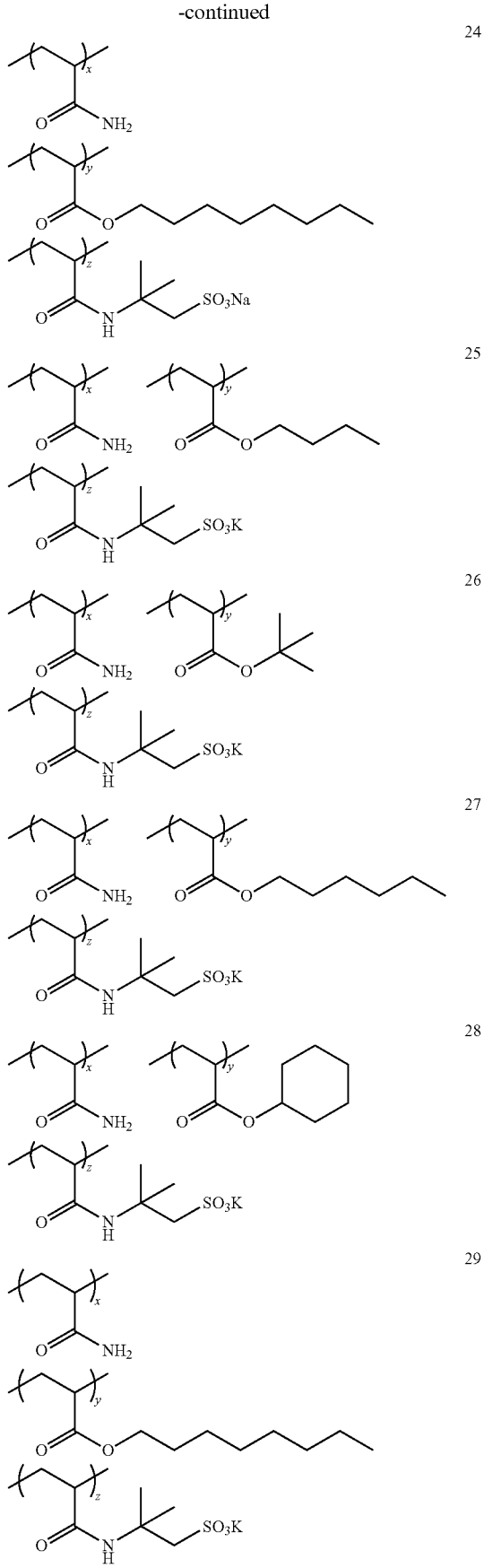

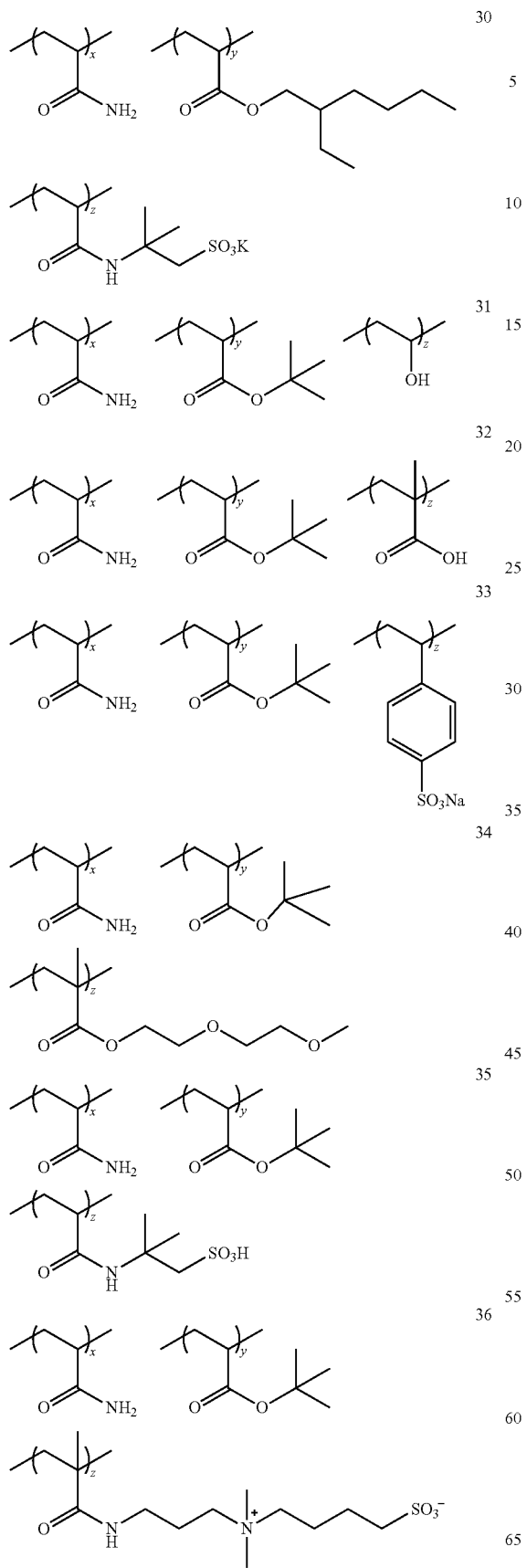
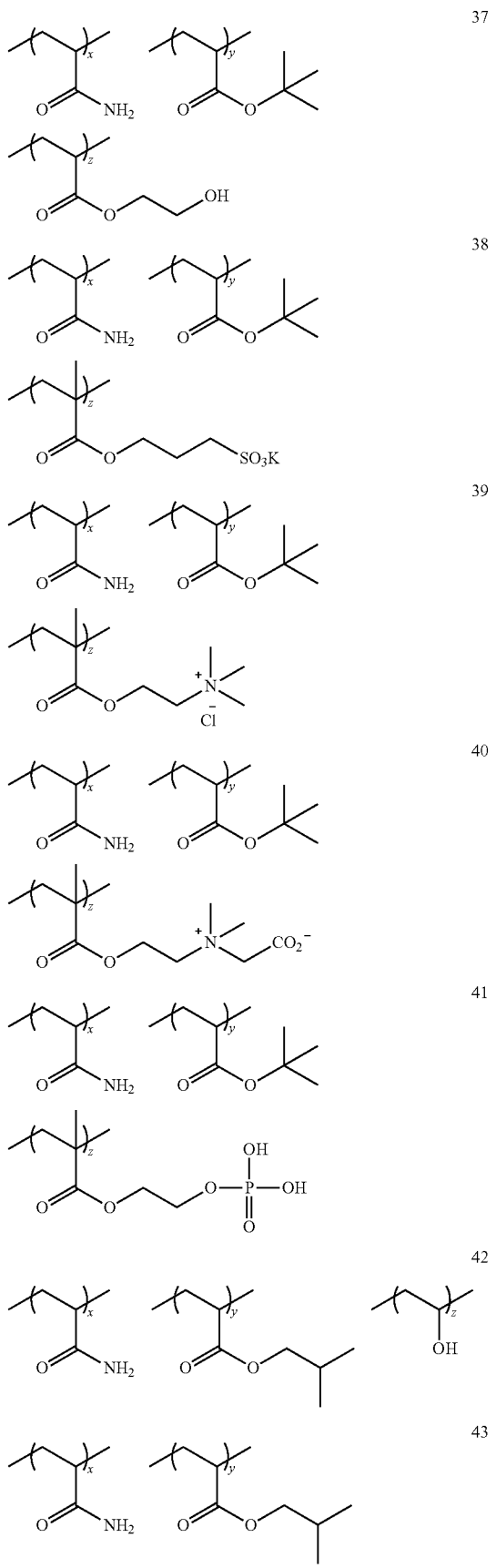

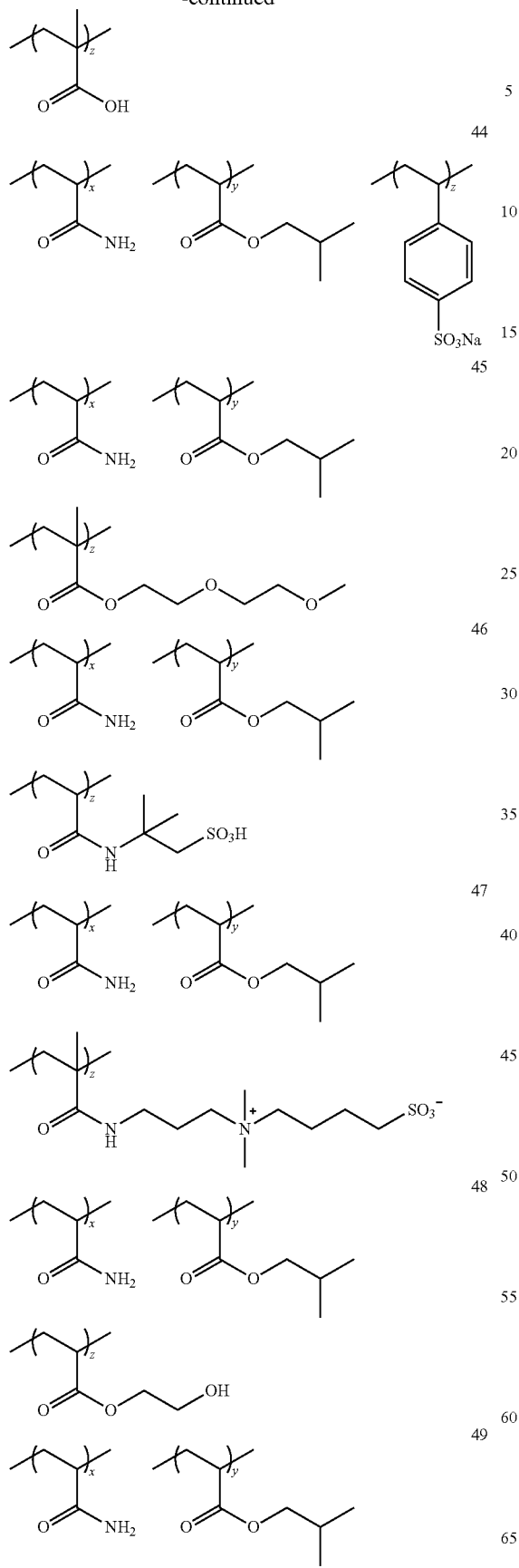

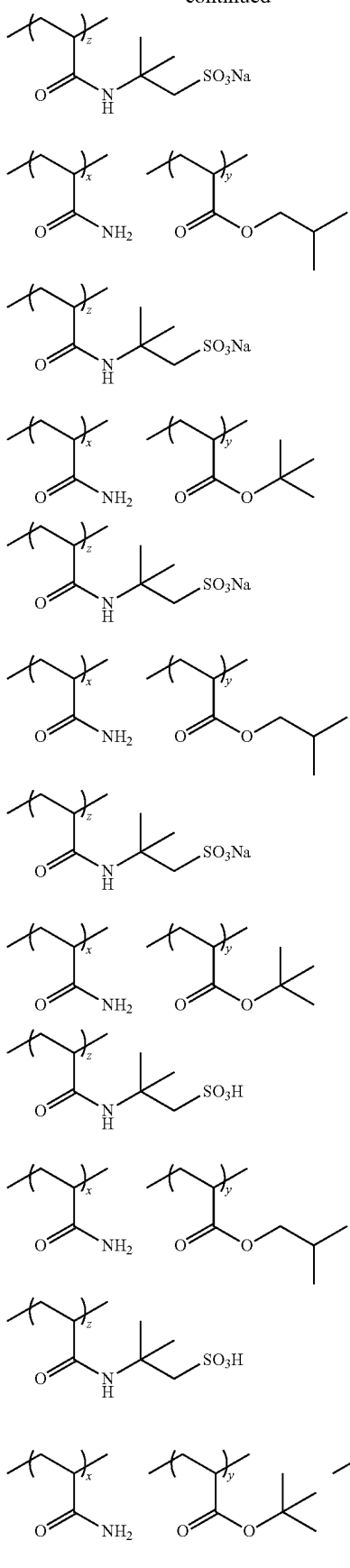

| Number of Hydrophilic Polymer | Composition Ratio (% by mole) | | | Mw |
|---|---|---|---|---|
| | x | y | z | |
| 1 to 52 | 74 | 25 | 1 | 20,000 |
| 53 | 94 | 5 | 1 | 20,000 |
| 54 | 89 | 10 | 1 | 20,000 |
| 55 | 84 | 15 | 1 | 20,000 |
| 56 | 79 | 20 | 1 | 20,000 |
| 57 | 72 | 27 | 1 | 20,000 |
| 58 | 94 | 5 | 1 | 20,000 |
| 59 | 89 | 10 | 1 | 20,000 |
| 60 | 84 | 15 | 1 | 20,000 |
| 61 | 79 | 20 | 1 | 20,000 |
| 62 | 72 | 27 | 1 | 20,000 |
| 63 | 74 | 25 | 1 | 200,000 |
| 64 | 74 | 25 | 1 | 100,000 |
| 65 | 74 | 25 | 1 | 50,000 |
| 66 | 74 | 25 | 1 | 30,000 |
| 67 | 74 | 25 | 1 | 10,000 |
| 68 | 74 | 25 | 1 | 200,000 |
| 69 | 74 | 25 | 1 | 100,000 |
| 70 | 74 | 25 | 1 | 50,000 |
| 71 | 74 | 25 | 1 | 30,000 |
| 72 | 74 | 25 | 1 | 10,000 |
| 73 | 74.7 | 25 | 0.3 | 20,000 |
| 74 | 73.5 | 25 | 1.5 | 20,000 |
| 75 | 73 | 25 | 2 | 20,000 |
| 76 | 72 | 25 | 3 | 20,000 |
| 77 | 70 | 25 | 5 | 20,000 |
| 78 | 74.7 | 25 | 0.3 | 20,000 |
| 79 | 73.5 | 25 | 1.5 | 20,000 |
| 80 | 73 | 25 | 2 | 20,000 |
| 81 | 72 | 25 | 3 | 20,000 |
| 82 | 70 | 25 | 5 | 20,000 |
| 83 | 74.7 | 25 | 0.3 | 20,000 |
| 84 | 73.5 | 25 | 1.5 | 20,000 |
| 85 | 73 | 25 | 2 | 20,000 |
| 86 | 72 | 25 | 3 | 20,000 |
| 87 | 70 | 25 | 5 | 20,000 |
| 88 | 74.7 | 25 | 0.3 | 20,000 |
| 89 | 73.5 | 25 | 1.5 | 20,000 |
| 90 | 73 | 25 | 2 | 20,000 |
| 91 | 72 | 25 | 3 | 20,000 |
| 92 | 70 | 25 | 5 | 20,000 |
| 93 | 74 | 25 | 1 | 20,000 |

(F) Inorganic Stratiform Compound

The protective layer according to the invention preferably contains an inorganic stratiform compound in order to obtain good oxygen-blocking property with a thin layer.

The inorganic stratiform compound is a particle having a thin tabular shape and includes, for instance, mica, for example, natural mica represented by the following formula: $A(B, C)_{2-5} D_4 O_{10} (OH, F, O)_2$, (wherein A represents any of Li, K, Na, Ca, Mg and an organic cation, B and C each represents any of Fe (II), Fe(III), Mn, Al, Mg and V, and D represents Si or Al) or synthetic mica, talc represented by the following formula: 3MgO.4SiO.H$_2$O, teniolite, montmorillonite, saponite, hectolite and zirconium phosphate.

Examples of the natural mica include muscovite, paragonite, phlogopite, biotite and lepidolite. Examples of the synthetic mica include non-swellable mica, for example, fluorphlogopite KMg$_3$(AlSi$_3$O$_{10}$)F$_2$ or potassium tetrasilic mica KMg$_{2.5}$(Si$_4$O$_{10}$)F$_2$, and swellable mica, for example, Na tetrasilic mica NaMg$_{2.5}$(Si$_4$O$_{10}$)F$_2$, Na or Li teniolite (Na, Li)Mg$_2$Li(Si$_4$O$_{10}$)F$_2$, or montmorillonite-based Na or Li hectolite (Na, Li)$_{1/8}$Mg$_{2/5}$Li$_{1/8}$(Si$_4$O$_{10}$)F$_2$. Synthetic smectite is also useful.

Of the inorganic stratiform compounds, mica is preferred and fluorine-based swellable mica, which is a synthetic inorganic stratiform compound, is particularly useful. Specifically, the swellable synthetic mica and an swellable clay mineral, for example, montmorillonite, saponite, hectolite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer results in lack of positive charge and to compensate it, a cation, for example, Li$^+$, Na$^+$, Ca$^{2+}$, Mg$^{2+}$ or an organic cation is adsorbed between the lattice layers. The inorganic stratiform compound swells upon contact with water. When share is applied under such condition, the stratiform crystal lattices are easily cleaved to form a stable sol in water. The bentnite and swellable synthetic mica have strongly such tendency.

As for the shape of the inorganic stratiform compound, from the standpoint of control of diffusion, the thinner the thickness or the larger the plain size as long as smoothness of coated surface and transmission of actinic radiation are not damaged, the better. Therefore, an aspect ratio of the inorganic stratiform compound is preferably 20 or more, more preferably 100 or more, and particularly preferably 200 or more. The aspect ratio is a ratio of major axis to thickness of particle and can be determined, for example, from a projection drawing of particle by a microphotography. The larger the aspect ratio, the greater the effect obtained.

As for a particle diameter of the inorganic stratiform compound, an average diameter thereof is preferably from 1 to 20 μm, more preferably from 1 to 10 μm, and particularly preferably from 2 to 5 μm. When the particle diameter is 1 μm or more, the inhibition of permeation of oxygen or moisture is sufficient and the effect of the inorganic stratiform compound can preferably be satisfactorily achieved. On the other hand, when it is 20 μm or less, the dispersion stability of the particle in the coating solution is sufficient to preferably conduct the stable coating. An average thickness of the particle is preferably 0.1 μm or less, more preferably 0.05 μm or less, and particularly preferably 0.01 μm or less. For example, with respect to the swellable synthetic mica that is the representative compound of the inorganic stratiform compound, the thickness is preferably approximately from 1 to 50 nm and the plain size is preferably approximately from 1 to 20 μm.

When such an inorganic stratiform compound particle having a large aspect ratio is incorporated into the protective layer, strength of the coated layer increases and penetration of oxygen or moisture can be effectively inhibited and thus, the protective layer can be prevented from deterioration due to deformation, and even when the lithographic printing plate precursor is preserved for a long period of time under a high humidity condition, it is prevented from decrease in the image-forming property of the lithographic printing plate precursor due to the change of humidity and the effect of excellent preservation stability can be obtained.

Further, a fluorine-based compound, a silicone-based compound or a wax-based emulsion can be added to the protective layer in order to prevent tackiness. When such a compound is added, the compound moves to the surface of the protective layer so that the tackiness resulting from the hydrophilic polymer disappears. The amount of the compound added is preferably from 0.1 to 5% by weight, and more preferably from 0.5 to 2.0% by weight, of the protective layer.

To the coating solution for protective layer can be added known additives, for example, an anionic surfactant, a nonionic surfactant, a cationic surfactant or a fluorine-based surfactant for improving the coating property or a water-soluble plasticizer for improving the physical property of the protective layer. Examples of the water-soluble plasticizer include propionamide, cyclohexane diol, glycerin and sorbitol. Further, to the coating solution for protective layer may be added known additives for improving properties, for example, adhesion property to the image-recording layer, time-lapse stability of the coating solution or ink receptive property.

The protective layer can be coated on the image-recording layer by a known method. The coating amount of the protective layer is preferably in a range form 0.01 to 10 g/m$^2$, more preferably in a range from 0.02 to 3 g/m$^2$, most preferably in a range from 0.02 to 1 g/m$^2$, in terms of the coating amount after drying.

(Image-Recording Layer)

The image-recording layer according to the invention is an image-recording layer which is capable of forming an image by removing an unexposed area with at least any of printing ink and dampening water on a printing machine after exposure and contains (A) an infrared absorbing dye, (B) a polymerization initiator, (C) a polymerizable compound and (D) a binder polymer having an alkylene oxide group. The image-recording layer capable of undergoing on-press development according to the invention preferably further contains (G) a hydrophobilizing precursor.

Hereinafter, each component capable of being incorporated into the image-recording layer will be described in order.

(D) Binder Polymer Having Alkylene Oxide Group

The binder polymer having an alkylene oxide group for use in the lithographic printing plate precursor according to the invention may have a poly(alkylene oxide) moiety in the main chain thereof or in the side chain thereof, or may be a graft polymer having a poly(alkylene oxide) in its side chain or a block copolymer composed of a block constituted by a repeating unit containing a poly(alkylene oxide) and a block constituted by a repeating unit not containing an (alkylene oxide).

In the case where the alkylene oxide group is present in the side chain, a polymer constituting its main chain includes an acrylic resin, a polyvinyl acetal resin, a polyurethane resin, a polyurea resin, a polyimide resin, a polyamide resin, an epoxy resin, a methacrylic resin, a polystyrene resin, a novolac type phenolic resin, a polyester resin, a synthesis rubber and a natural rubber. In particular, an acrylic resin is preferred.

The alkylene oxide is preferably an alkylene oxide having from 2 to 6 carbon atoms, and particularly preferably an ethylene oxide or a propylene oxide.

A repeating number of alkylene oxide in the poly(alkylene oxide) moiety is ordinarily from 2 to 120, preferably from 2 to 70, and more preferably from 2 to 50.

It is preferred that the repeating number of alkylene oxide is 120 or less because both the deterioration of printing durability due to abrasion and the deterioration of printing durability due to decrease in the ink receptivity are prevented.

The poly(alkylene oxide) moiety is preferably introduced into an side chain of the binder as a structure represented by formula (8) shown below. More preferably, it is introduced into a side chain of an acrylic resin as a structure represented by formula (8) shown below.

Formula (8):

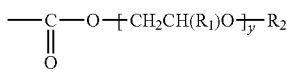

In formula (8), y represents a number from 2 to 120, preferably from 2 to 70, and more preferably from 2 to 50. $R_1$ represents a hydrogen atom or an alkyl group. $R_2$ represents a hydrogen atom or an organic group. The organic group is preferably an alkyl group having from 1 to 6 carbon atoms and includes a methyl group, an ethyl group, an n-propyl group, an isopropyl group, an n-butyl group, a sec-butyl group, an isobutyl group, a tert-butyl group, an n-pentyl group, an isopentyl group, a neopentyl group, an n-hexyl group, an isohexyl group, a 1,1-dimethylbutyl group, a 2,2-dimethylbutyl group, a cyclopentyl group and a cyclohexyl group.

In formula (4), $R_1$ is preferably a hydrogen atom or a methyl group and most preferably a hydrogen atom. $R_2$ is most preferably a hydrogen atom or a methyl group.

The binder polymer for use in the invention preferably satisfies (a) and/or (b) shown below from the standpoint of on-press development property.
(a) The content of a monomer unit having an alkylene oxide group in the binder polymer is 30% by weight or more.
(b) The content of a monomer unit having a carboxylic acid group in the binder polymer is less than 1% by weight.

The binder polymer may have a crosslinking property in order to improve the film strength of the image area. In order to impart the crosslinking property to the binder polymer, a crosslinkable functional group, for example, an ethylenically unsaturated bond is introduced into a main chain or side chain of the polymer. The crosslinkable functional group may be introduced by copolymerization.

Examples of the polymer having an ethylenically unsaturated bond in the main chain thereof include poly-1,4-butadiene and poly-1,4-isoprene.

Examples of the polymer having an ethylenically unsaturated bond in the side chain thereof include a polymer of an ester or amide of acrylic acid or methacrylic acid, which is a polymer wherein the ester or amido residue (R in —COOR or —CONHR) has an ethylenically unsaturated bond.

Examples of the residue (R described above) having an ethylenically unsaturated bond include —(CH$_2$)$_n$CR$^1$=CR$^2$R$^3$, —(CH$_2$O)$_n$CH$_2$CR$^1$=CR$^2$R$^3$, —(CH$_2$CH$_2$O)$_n$CH$_2$CR$^1$=CR$^2$R$^3$, —(CH$_2$)$_n$NH—CO—O—CH$_2$CR$^1$=CR$^2$R$^3$, —(CH$_2$)$_n$—O—CO—CR$^1$=CR$^2$R$^3$ and —(CH$_2$CH$_2$O)$_2$—X (wherein R$^1$ to R$^3$ each represents a hydrogen atom, a halogen atom or an alkyl group having from 1 to 20 carbon atoms, an aryl group, alkoxy group or aryloxy group, or R$^1$ and R$^2$ or R$^1$ and R$^3$ may be combined with each other to form a ring. n represents an integer from 1 to 10. X represents a dicyclopentadienyl residue).

Specific examples of the ester residue include —CH$_2$CH=CH$_2$ (described in JP-B-7-21633 (the term "JP-B" as used herein means an "examined Japanese patent publication")), —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$—NH—COO—CH$_2$CH=CH$_2$ and —CH$_2$CH$_2$O—X (wherein X represents a dicyclopentadienyl residue).

Specific examples of the amido residue include —CH$_2$CH=CH$_2$, —CH$_2$CH$_2$—Y (wherein Y represents a cyclohexene residue) and —CH$_2$CH$_2$—OCO—CH=CH$_2$.

The binder polymer having crosslinkable property is cured, for example, by addition of a free radical (a polymerization initiating radical or a growing radical of a polymerizable compound in the process of polymerization) to the crosslinkable functional group of the polymer and undergoing addition polymerization between the polymers directly or through a polymerization chain of the polymerizable compound to form crosslinkage between the polymer molecules. Alternately, it is cured by generation of a polymer radical upon extraction of an atom (for example, a hydrogen atom on a carbon atom adjacent to the functional crosslinkable group) in the polymer by a free radial and connecting the polymer radicals with each other to form cross-linkage between the polymer molecules.

The content of the crosslinkable group (content of the radical polymerizable unsaturated double bond determined by iodine titration) in the binder polymer is preferably from 0.1 to 10.0 mmol, more preferably from 1.0 to 7.0 mmol, most preferably from 2.0 to 5.5 mmol, based on 1 g of the binder polymer. In the range described above, good sensitivity and good preservation stability can be obtained.

Specific examples (1) to (10) of the binder polymer for use in the invention are set forth below, but the invention should not be construed as being limited thereto.

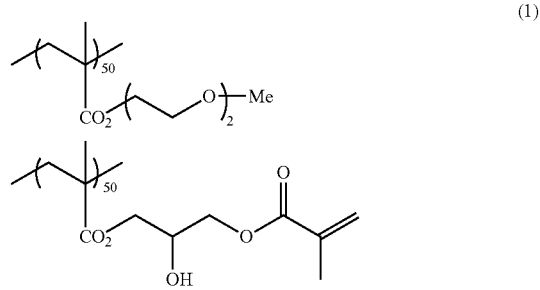

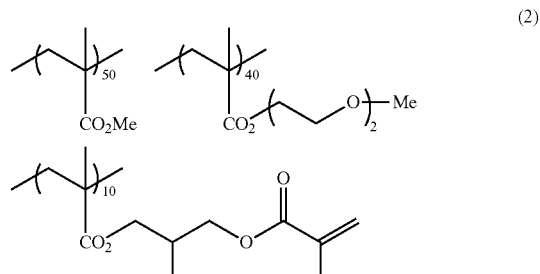

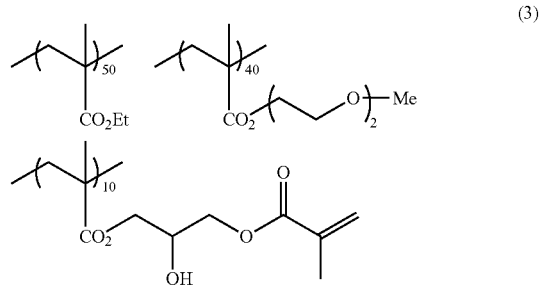

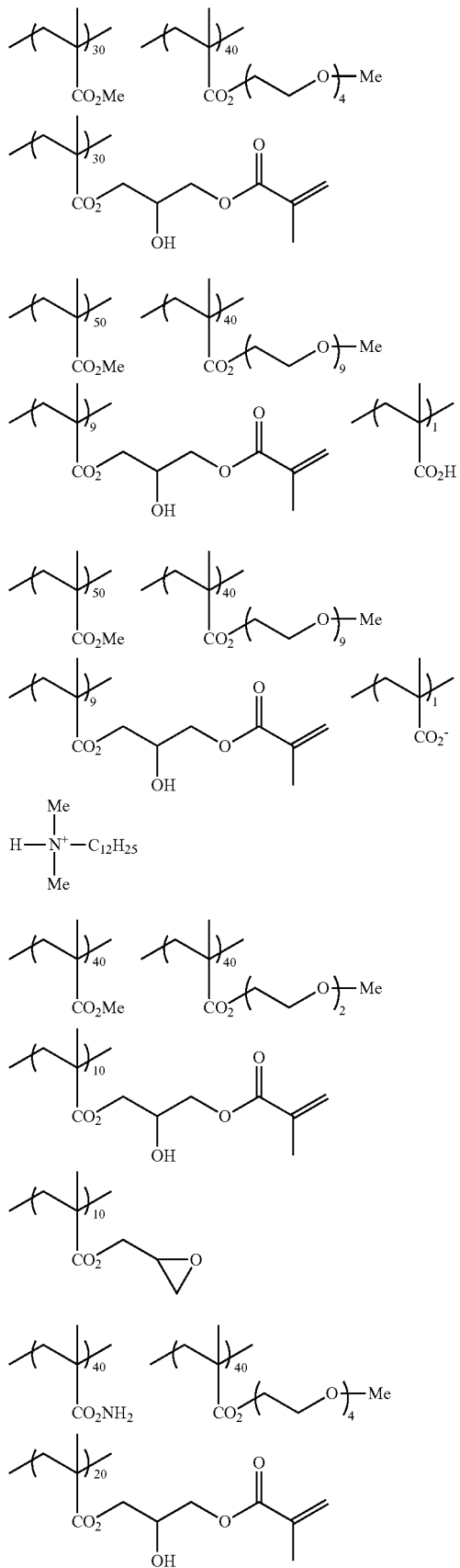

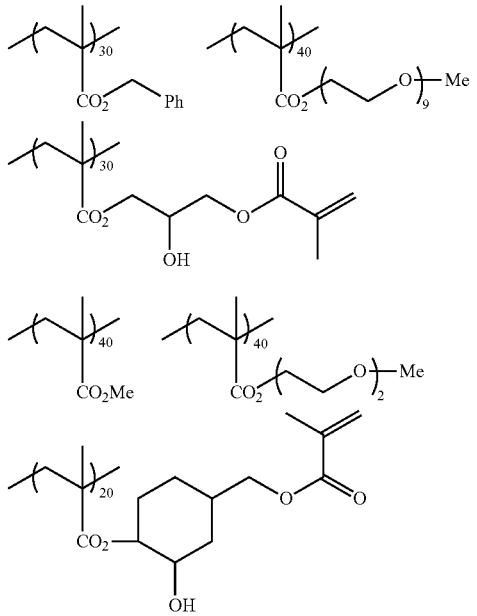

The weight average molecular weight (Mw) of the binder polymer according to the invention is preferably 2,000 or more, more preferably 5,000 or more, and still more preferably from 10,000 to 300,000.

According to the invention, a hydrophilic polymer compound, for example, polyacrylic acid or polyvinyl alcohol described in JP-A-2008-195018 may be used together, if desired. Further, an oleophilic polymer compound may be used in combination with a hydrophilic polymer compound.

As for the configuration of the binder polymer according to the invention, it may be present as a binder acting as a bond of each ingredient or in the form of fine particle in the image-recording layer. In the case of existing in the form of fine particle, the average particle size thereof is preferably in a range from 10 to 1,000 nm, more preferably in a range from 20 to 300 nm, and particularly preferably in a range from 30 to 120 nm.

The content of the binder polymer according to the invention is preferably from 5 to 90% by weight, more preferably from 5 to 80% by weight, still more preferably from 10 to 70% by weight, based on the total solid content of the image-recording layer.

(A) Infrared Absorbing Dye

The infrared absorbing dye has a function of converting the infrared ray absorbed to heat and a function of being excited by the infrared ray to perform electron transfer and/or energy transfer to a polymerization initiator described hereinafter. The infrared absorbing dye for use in the invention includes a dye having an absorption maximum in a wavelength range from 760 to 1,200 nm.

As the dye, commercially available dyes and known dyes described in literatures, for example, *Senryo Binran* (*Dye Handbook*) compiled by The Society of Synthetic Organic Chemistry, Japan (1970) can be used. Specifically, the dye includes an azo dye, a metal complex azo dye, a pyrazolone azo dye, a naphthoquinone dye, an anthraquinone dye, a phthalocyanine dye, a carbonium dye, a quinoneimine dye, a methine dye, a cyanine dye, a squarylium dye, a pyrylium salt and a metal thiolate complex.

Of the dyes, a cyanine dye, a squarylium dye, a pyrylium salt, a nickel thiolate complex or an indolenine cyanine dye is particularly preferred. A cyanine dye or an indolenine cyanine dye is more preferred. As a particularly preferred example of the dye, a cyanine dye represented by formula (a) shown below is exemplified.

Formula (a):

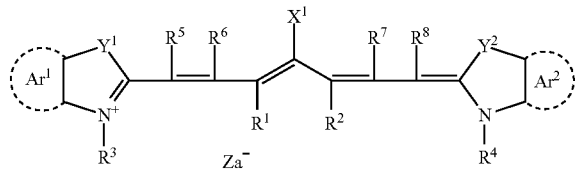

In formula (a), $X^1$ represents a hydrogen atom, a halogen atom, $-N(R^9)(R^{10})$, $-X^2-L^1$ or a group shown below. $R^9$ and $R^{10}$, which may be the same or different, each represents an aromatic hydrocarbon group having from 6 to 10 carbon atoms which may have a substituent, an alkyl group having from 1 to 8 carbon atoms which may have a substituent or a hydrogen atom, or $R^9$ and $R^{10}$ may be combined with each other to form a ring. $R^9$ and $R^{10}$ each preferably represents a phenyl group. $X^2$ represents an oxygen atom or a sulfur atom. $L^1$ represents a hydrocarbon group having from 1 to 12 carbon atoms, an aromatic ring group containing a hetero atom or a hydrocarbon group having from 1 to 12 carbon atoms and containing a hetero atom. The hetero atom used herein indicates a nitrogen atom, a sulfur atom, an oxygen atom, a halogen atom or a selenium atom. $Xa^-$ has the same meaning as $Za^-$ defined hereinafter. $R^a$ represents a hydrogen atom or a substituent selected from an alkyl group, an aryl group, a substituted or unsubstituted amino group and a halogen atom.

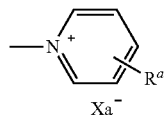

$R^1$ and $R^2$ each independently represents a hydrocarbon group having from 1 to 12 carbon atoms. In view of the preservation stability of a coating solution for image-recording layer, it is preferred that $R^1$ and $R^2$ each represents a hydrocarbon group having two or more carbon atoms. Alternatively, $R^1$ and $R^2$ may be combined with each other to form a ring and in the case of forming a ring, it is particularly preferred that $R^1$ and $R^2$ are combined with each other to form a 5-membered or 6-membered ring.

$Ar^1$ and $Ar^2$, which may be the same or different, each represents an aryl group which may have a substituent. Preferred examples of the aryl group include a benzene ring group and a naphthalene ring group. Preferred examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms which may have a substituent. Preferred examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (a) has an anionic substituent in the structure thereof and neutralization of charge is not needed. Preferred examples of the counter ion for $Za^-$ include a halide ion, a perchlorate ion, a tetrafluoroborate ion, a hexafluorophosphate ion and a sulfonate ion, and particularly preferred examples thereof include a perchlorate ion, a hexafluorophosphate ion and an arylsulfonate ion in view of the preservation stability of a coating solution for image-recording layer.

Specific examples of the cyanine dye represented by formula (a), which can be preferably used in the invention, include compounds described in Paragraph Nos. [0017] to [0019] of JP-A-2001-133969, Paragraph Nos. [0012] to [0021] of JP-A-2002-23360 and Paragraph Nos. [0012] to [0037] of JP-A-2002-40638, preferably compounds described in Paragraph Nos. [0034] to [0041] of JP-A-2002-278057 and Paragraph Nos. [0080] to [0086] of JP-A-2008-195018, and most preferably compounds described in Paragraph Nos. [0035] to [0043] of JP-A-2007-90850.

Also, compounds described in Paragraph Nos. [0008] to [0009] of JP-A-5-5005 and Paragraph Nos. [0022] to [0025] of JP-A-2001-222101 are preferably used.

The infrared absorbing dyes (A) may be used only one kind or in combination of two or more kinds thereof and it may also be used together with an infrared absorbing agent other than the infrared absorbing dye, for example, a pigment. As the pigment, compounds described in Paragraph Nos. [0072] to [0076] of JP-A-2008-195018 are preferred.

The content of the infrared absorbing dye in the image-recording layer according to the invention is preferably from 0.1 to 10.0% by weight, more preferably from 0.5 to 5.0% by weight, based on the total solid content of the image-recording layer.

(B) Polymerization Initiator

The polymerization initiator (B) for use in the invention is a compound which initiates or accelerates polymerization of a polymerizable compound (C). The polymerization initiator for use in the invention is preferably a radical polymerization initiator and includes, for example, a known thermal polymerization initiator, a compound containing a bond having small bond dissociation energy and a photopolymerization initiator.

The polymerization initiator according to the invention include, for example, (a) an organic halide, (b) a carbonyl compound, (c) an azo compound, (d) an organic peroxide, (e) a metallocene compound, (f) an azido compound, (g) a hexaarylbiimidazole compound, (h) an organic borate salt compound, (i) a disulfone compound, (j) an oxime ester compound, (k) an onium salt compound and (l) a carboxylic acid-based compound.

As the organic halide (a), compounds described in Paragraph Nos. [0022] to [0023] of JP-A-2008-195018 are preferred.

As the carbonyl compound (b), compounds described in Paragraph No. [0024] of JP-A-2008-195018 are preferred.

As the azo compound (c), for example, azo compounds described in JP-A-8-108621 are used.

As the organic peroxide (d), for example, compounds described in Paragraph No. [0025] of JP-A-2008-195018 are preferred.

As the metallocene compound (e), for example, compounds described in Paragraph No. [0026] of JP-A-2008-195018 are preferred.

As the azido compound (f), a compound, for example, 2,6-bis(4-azidobenzylidene)-4-methylcyclohexanone is exemplified.

As the hexaarylbiimidazole compound (g), for example, compounds described in Paragraph No. [0027] of JP-A-2008-195018 are preferred.

As the organic borate salt compound (h), for example, compounds described in Paragraph No. [0028] of JP-A-2008-195018 are preferred.

As the disulfone compound (i), for example, compounds described in JP-A-61-166544 and JP-A-2002-328465 are exemplified.

As the oxime ester compound (j), for example, compounds described in Paragraph Nos. [0028] to [0030] of JP-A-2008-195018 are preferred.

As the onium salt compound (k), onium salts capable of generating a radical upon decomposition with light or heat, for example, diazonium salts described in S. I. Schlesinger, *Photogr. Sci. Eng.*, 18, 387 (1974), T. S. Bal et al., *Polymer*, 21, 423 (1980) and JP-A-5-158230, ammonium salts described in U.S. Pat. No. 4,069,055 and JP-A-4-365049, phosphonium salts described in U.S. Pat. Nos. 4,069,055 and 4,069,056, iodonium salts described in European Patent 104, 143, U.S. Patent Publication No. 2008/0311520, JP-A-2-150848, JP-A-2008-195018 and J. V. Crivello et al., *Macromolecules*, 10 (6), 1307 (1977), sulfonium salts described in European Patents 370,693, 233,567, 297,443 and 297,442, U.S. Pat. Nos. 4,933,377, 4,760,013, 4,734,444 and 2,833,827 and German Patents 2,904,626, 3,604,580 and 3,604,581, selenonium salts described in J. V. Crivello et al., *J. Polymer Sci., Polymer Chem. Ed.*, 17, 1047 (1979), arsonium salts described in C. S. Wen et al., *Teh, Proc. Conf. Rad. Curing ASIA*, p. 478, Tokyo, Oct. (1988), and azinium salts described in JP-A-2008-195018 are exemplified.

As the carboxylic acid-based compound (l), for example, compounds described in Paragraph Nos. [0118] to [0164] of U.S. Patent Publication No. 2003/0118939, Paragraph Nos. [0065] to [0068] of U.S. Patent Publication No. 2004/0091811, Paragraph Nos. [0114] to [0162] of U.S. Patent Publication No. 2004/0259027 and Paragraph Nos. [0071] to [0115] of JP-A-2005-059446 are exemplified.

Of the polymerization initiators described above, the hexaarylbiimidazole compound (g), organic borate salt compound (h), onium salt compound (k) or carboxylic acid-based compound (l) is preferred, the organic borate salt compound (h), onium salt compound (k) or carboxylic acid-based compound (l) is more preferred, and the onium salt compound (k) is particularly preferred. Of the onium salt compounds, the iodonium salt, sulfonium salt or azinium salt is preferred.

The radical polymerization initiators may be used individually only one kind or in combination of two or more kinds thereof. In the case of using in combination of two or more kinds thereof, it is preferred to use the onium salt compound (k) together with the organic borate salt compound (h) or carboxylic acid-based compound (l).

Specific examples of these compounds are set forth below, but the invention should not be construed as being limited thereto.

Of the iodonium salts, a diphenyliodonium salt is preferred. In particular, a diphenyliodonium salt substituted with an electron donating group, for example, an alkyl group or an alkoxy group is preferred, and an asymmetric diphenyliodonium salt is more preferred. Specific examples of the iodonium salt include diphenyliodonium hexafluorophosphate, 4-methoxyphenyl-4-(2-methylpropyl)phenyliodonium hexafluorophosphate, 4-(2-methylpropyl)phenyl-p-tolyliodonium hexafluorophosphate, 4-hexyloxyphenyl-2,4,6-trimethoxyphenyliodonium hexafluorophosphate, 4-hexyloxyphenyl-2,4-diethoxyphenyliodonium tetrafluoroborate, 4-octyloxyphenyl-2,4,6-trimethoxyphenyliodonium 1-perfluorobutanesulfonate, 4-octyloxyphenyl-2,4,6-trimethoxyphenyliodonium hexafluorophosphate and bis(4-tert-butylphenyl)iodonium tetraphenylborate.

Examples of the sulfonium salt include triphenylsulfonium hexafluorophosphate, triphenylsulfonium benzoylformate, bis(4-chlorophenyl)phenylsulfonium benzoylformate, bis(4-chlorophenyl)-4-methylphenylsulfonium tetrafluoroborate, tris(4-chlorophenyl)sulfonium 3,5-bis(methoxycarbonyl)benzenesulfonate and tris(4-chlorophenyl)sulfonium hexafluorophosphate.

Examples of the azinium salt include 1-cyclohexylmethyloxypyridinium hexafluorophosphate, 1-cyclohexyloxy-4-phenylpyridinium hexafluorophosphate, 1-ethoxy-4-phenylpyridinium hexafluorophosphate, 1-(2-ethylhexyloxy)-4-phenylpyridinium hexafluorophosphate, 4-chloro-1-cyclohexylmethyloxypyridinium hexafluorophosphate, 1-ethoxy-4-cyanopridinium hexafluorophosphate, 3,4-dichloro-1-(2-ethylhexyloxy)pyridinium hexafluorophosphate, 1-benzyloxy-4-phenylpyridinium hexafluorophosphate, 1-phenethyloxy-4-phenylpyridinium hexafluorophosphate, 1-(2-ethylhexyloxy)-4-phenylpridinium p-toluenesulfonate, 1-(2-ethylhexyloxy)-4-phenylpyridinium perfluorobutanesulfonate, 1-(2-ethylhexyloxy)-4-phenylpyridinium bromide and 1-(2-ethylhexyloxy)-4-phenylpridinium tetrafluoroborate.

Specific examples of the organic borate salt compound include tetraphenyl borate salt, tetratolyl borate salt, tetrakis(4-methoxyphenyl) borate salt, tetrakis(pentafluorophenyl) borate salt, tetrakis(3,5-bis(trifluoromethyl)phenyl) borate salt, tetrakis(4-chlorophenyl) borate salt, tetrakis(4-fluorophenyl) borate salt, tetrakis(2-thienyl) borate salt, tetrakis(4-methoxyphenyl) borate salt, tetrakis(4-phenylphenyl) borate salt, tetrakis(4-tert-butylphenyl) borate salt, ethyl triphenyl borate salt and butyl triphenyl borate salt. As a counter cation of the borate salt, a known cation, for example, an alkali metal cation, an alkaline earth metal cation, an ammonium cation, a phosphonium cation, a sulfonium cation, iodonium cation a diazonium cation or an azinium cation is exemplified.

Specific examples of the carboxylic acid-based compound include N-phenyliminidiacetic acid, (p-acetamidophenylimino)diacetic acid, 4-[bis(carboxymethyl)amino]benzoic acid, 3-[bis(carboxymethyl)amino]-2-naphthalenecarboxylic acid, N,N'-1,3-phenylenebisglycine, N,N'1,3-phenylenebis[N-(carboxymethyl)]glycine, N,N'-1,2-phenylenebis[N-(carboxymethyl)]glycine, N-(carboxymethyl)-N-(4-methoxyphenyl)glycine, N-(carboxymethyl)-N-(3-methoxyphenyl)glycine, N-(carboxymethyl)-N-(3-hydroxyphenyl)glycine, N-(carboxymethyl)-N-(4-bromophenyl)glycine, N-(carboxymethyl)-N-(4-chlorophenyl)glycine, N-(carboxymethyl)-N-(4-ethylphenyl)glycine, N-(carboxymethyl)-N-(3,4-dimethylphenyl)glycine, N-(carboxymethyl)-N-(3,5-dimethylphenyl)glycine, N-(carboxymethyl)-N-(2,6-dimethylphenyl)glycine, N-(carboxymethyl)-N-methylglycine, N,N-diphenylglycine, N-phenyl-N-(phenylaminocarbonylmethyl)glycine, N-phenyl-N-(ethoxycarbonylmethyl)glycine, N-(3,4,5-trimethoxyphenyl)-N-(methoxycarbonylmethyl)glycine, N-(4-dimethylaminophenyl)-N-(methoxycarbonylmethyl) glycine, N-(carboxymethyl)-N-ethylanthranilic acid, N-(2-carboxyphenyl)glycine, o-dianisidine-N,N,N',N'-tetraacetic acid, N,N'-(1,2-ethanediylbis(oxy-2,1-phenylene)bis-N-(carboxymethyl)glycine), 4-carboxyphenoxyacetic acid, catechol-O,O'-diacetic acid, 4-methylcatechol-O,O'-diacetic acid, resorcinol-O,O'-diacetic acid, hydroquinone-O,O'-diacetic acid, 4,4'-isopropylidenediphenoxyacetic acid, 2-(carboxymethylthio)benzoic acid, 3-[(carboxymethyl)thio-2-naphthalenecarboxylic acid, N-phenylglycine, (2-methoxyphenoxy)acetic acid, phenoxyacetic acid, (3,4-dimethoxyphenylthio)acetic acid, indole-3-acetic acid, phenylthioacetic acid, N-methylindole-3-acetic acid and 4-dimethylaminophenylacetic acid.

The polymerization initiator in the invention can be added preferably in an amount from 0.1 to 50% by weight, more preferably from 0.5 to 30% by weight, particularly preferably from 0.8 to 20% by weight, based on the total solid content constituting the image-recording layer. In the range described above, good sensitivity and good stain resistance in the non-image area at the time of printing are obtained.

(C) Polymerizable Compound

The radical polymerizable compound for use in the image-recording layer according to the invention is an addition-polymerizable compound having at least one ethylenically unsaturated double bond and it is selected from compounds having at least one, preferably two or more, terminal ethylenically unsaturated double bonds. The polymerizable compound has a chemical form, for example, a monomer, a prepolymer, specifically, a dimer, a trimer or an oligomer, or a mixture thereof.

Examples of the monomer include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with a polyhydric alcohol compound and amides of an unsaturated carboxylic acid with a polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used. These compounds are described in references including JP-T-2006-508380 (the term "JP-T" as used herein means a published Japanese translation of a PCT patent application), JP-A-2002-287344, JP-A-2008-256850, JP-A-2001-342222, JP-A-9-179296, JP-A-9-179297, JP-A-9-179298, JP-A-2004-294935, JP-A-2006-243493, JP-A-2002-275129, JP-A-2003-64130, JP-A-2003-280187 and JP-A-10-333321.

Specific examples of the monomer, which is an ester of a polyhydric alcohol compound with an unsaturated carboxylic acid, include, as an acrylic acid ester, for example, ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO) modified triacrylate and polyester acrylate oligomer. As a methacrylic acid ester, for example, tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane and bis[p-(methacryloxyethoxy)phenyl]dimethylmethane are exemplified. Specific examples of the monomer, which is an amide of a polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Urethane type addition-polymerizable compounds produced using an addition reaction between an isocyanate and a hydroxy group are also preferably used and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708 (the term "JP-B" as used herein means an "examined Japanese patent publication").

$$CH_2=C(R^4)COOCH_2CH(R^5)OH \qquad (A)$$

wherein $R^4$ and $R^5$ each independently represents H or $CH_3$.

Also, urethane acrylates as described in JP-A-51-37193, JP-B-2-32293, JP-B-2-16765, JP-A-2003-344997 and JP-A-2006-65210, urethane compounds having an ethylene oxide skeleton described in JP-B-58-49860, JP-B-56-17654, JP-B-62-39417, JP-B-62-39418, JP-A-2000-250211 and JP-A-2007-94138, and urethane compounds having a hydrophilic group described in U.S. Pat. No. 7,153,632, JP-T-8-505958, JP-A-2007-293221 and JP-A-2007-293223 are preferably used.

Of the compounds described above, an isocyanuric acid ethyleneoxide-modified acrylate, for example, tris(acryloyloxyethyl)isocyanurate or bis(acryloyloxyethyl)hydroxyethyl isocyanurate is particularly preferred from the standpoint of excellent balance between hydrophilicity relating to the on-press development property and polymerization ability relating to the printing durability.

Details of the method of using the polymerizable compound, for example, selection of the structure, individual or combination use or an amount added, can be appropriately determined in accordance with the characteristic design of the final lithographic printing plate precursor. The polymerizable compound is used preferably in a range from 5 to 75% by weight, more preferably in a range from 10 to 70% by weight, particularly preferably in a range from 15 to 60% by weight, based on the total solid content of the image-recording layer.

(G) Hydrophobilizing Precursor

It is preferable, in the invention, to use a hydrophobilizing precursor in order to improve on-press development property. The hydrophobilizing precursor in the invention means a fine particle capable of converting the image-recording layer to be hydrophobic when heat is applied. The fine particle is preferably at least one fine particle selected from hydrophobic thermoplastic polymer fine particle, thermo-reactive polymer fine particle, polymer fine particle having a polymerizable group, microcapsule having a hydrophobic compound encapsulated and microgel (crosslinked polymer fine particle). Among them, polymer fine particle having a polymerizable group and microgel are preferred.

As the hydrophobic thermoplastic polymer fine particle, hydrophobic thermoplastic polymer fine particles described, for example, in Research Disclosure, No. 333003, January (1992), JP-A-9-123387, JP-A-9-131850, JP-A-9-171249, JP-A-9-171250 and European Patent 931,647 are preferably exemplified.

Specific examples of the polymer constituting the polymer fine particle include a homopolymer or copolymer of a monomer, for example, ethylene, styrene, vinyl chloride, methyl acrylate, ethyl acrylate, methyl methacrylate, ethyl methacrylate, vinylidene chloride, acrylonitrile, vinyl carbazole or an acrylate or methacrylate having a polyalkylene structure and a mixture thereof. Among them, polystyrene, a copolymer containing styrene and acrylonitrile and polymethyl methacrylate are more preferred.

The average particle size of the hydrophobic thermoplastic polymer fine particle for use in the invention is preferably from 0.01 to 2.0 μm.

The thermo-reactive polymer fine particle for use in the invention includes polymer fine particle having a thermo-reactive group and forms a hydrophobilized region by crosslinkage due to thermal reaction and change in the functional group involved therein.

As the thermo-reactive group of the polymer fine particle having a thermo-reactive group for use in the invention, although a functional group performing any reaction can be used as long as a chemical bond is formed, a polymerizable group is preferred. For instance, an ethylenically unsaturated group (for example, an acryloyl group, a methacryloyl group, a vinyl group or an allyl group) performing a radical polymerization reaction, a cationic polymerizable group (for example, a vinyl group, a vinyloxy group, an epoxy group or an oxetanyl group), an isocyanate group performing an addition reaction or a blocked form thereof, an epoxy group, a vinyloxy group and a functional group having an active hydrogen atom (for example, an amino group, a hydroxy group or a carboxyl group) as the reaction partner thereof, a carboxyl group performing a condensation reaction and a hydroxyl group or an amino group as the reaction partner thereof; and an acid anhydride performing a ring opening addition reaction and an amino group or a hydroxyl group as the reaction partner thereof are preferably exemplified.

As the microcapsule for use in the invention, microcapsule having all or part of the constituting components of the image-recording layer encapsulated as described, for example, in JP-A-2001-277740 and JP-A-2001-277742 is exemplified. The constituting components of the image-recording layer may be present outside the microcapsules. It is a more preferred embodiment of the image-recording layer containing microcapsules that the hydrophobic constituting components are encapsulated in microcapsules and the hydrophilic components are present outside the microcapsules.

The image-recording layer according to the invention may be an embodiment containing crosslinked resin particle, that is, a microgel. The microgel can contain a part of the constituting components of the image-recording layer at least one of in the inside and on the surface thereof. Particularly, an embodiment of a reactive microgel containing a radical polymerizable group on the surface thereof is preferred in view of the image-forming sensitivity and printing durability.

As a method of microencapsulation or microgelation of the constituting components of the image-recording layer, known methods can be used.

The average particle size of the microcapsule or microgel is preferably from 0.01 to 3.0 μm, more preferably from 0.05 to 2.0 μm, particularly preferably from 0.10 to 1.0 μm. In the range described above, good resolution and good time lapse stability are achieved.

The content of the hydrophobilizing precursor is preferably in a range from 5 to 90% by weight based on the total solid content of the image-recording layer.

(H) Other Components

The image-recording layer according to the invention may further contain other components, if desired.

(1) Hydrophilic Low Molecular Weight Compound

The image-recording layer according to the invention may contain a hydrophilic low molecular weight compound in order to improve the on-press development property without accompanying the decrease in the printing durability.

The hydrophilic low molecular weight compound includes a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyol compound, e.g., glycerine, pentaerythritol or tris(2-hydroxyethyl)isocyanurate, an organic amine compound, e.g., triethanol amine, diethanol amine or monoethanol amine, or a salt thereof, an organic sulfonic acid compound, e.g., an alkyl sulfonic acid, toluene sulfonic acid or benzene sulfonic acid, or a salt thereof, an organic sulfamic acid compound, e.g., an alkyl sulfamic acid, or a salt thereof, an organic sulfuric acid compound, e.g., an alkyl sulfuric acid or an alkyl ether sulfuric acid, or a salt thereof, an organic phosphonic acid compound, e.g., phenyl phosphonic acid, or a salt thereof, an organic carboxylic acid, e.g., tartaric acid, oxalic acid, citric acid, malic acid, lactic acid, gluconic acid or an amino acid, or a salt thereof and a betaine compound.

According to the invention, it is preferred to incorporate at least one compound selected from a polyol compound, an organic sulfate compound, an organic sulfonate compound and a betaine compound into the image-recording layer.

Specific examples of the organic sulfonate compound include an alkylsulfonate, for example, sodium n-butylsulfonate, sodium n-hexylsulfonate, sodium 2-ethylhexylsulfonate, sodium cyclohexylsulfonate or sodium n-octylsulfonate; an alkylsulfonate containing an ethylene oxide chain, for example, sodium 5,8,11-trioxapentadecane-1-sulfonate, sodium 5,8,11-trioxaheptadecane-1-sulfonate, sodium 13-ethyl-5,8,11-trioxaheptadecane-1-sulfonate or sodium 5,8,11,14-tetraoxatetracosane-1-sulfonate; an arylsulfonate, for example, sodium benzenesulfonate, sodium p-toluenesulfonate, sodium p-hydroxybenzenesulfonate, sodium p-styrenesulfonate, sodium isophthalic acid dimethyl-5-sulfonate, sodium 1-naphtylsulfonate, sodium 4-hydroxynaphtylsulfonate, disodium 1,5-naphthalenedisulfonate or trisodium 1,3,6-naphthalenetrisulfonate, and compounds described in Paragraph Nos. [0026] to [0031] of JP-A-2007-276454 and Paragraph Nos. [0020] to [0047] of JP-A-2009-154525. The salt may also be potassium salt or lithium salt.

The organic sulfate compound includes a sulfate of alkyl, alkenyl, alkenyl, aryl or heterocyclic monoether of polyethylene oxide. The number of ethylene oxide unit is preferably from 1 to 4. The salt is preferably a sodium salt, a potassium salt or a lithium salt. Specific examples thereof include compounds described in Paragraph Nos. [0034] to [0038] of JP-A-2007-276454.

As the betaine compound, a compound wherein a number of carbon atoms included in a hydrocarbon substituent on the nitrogen atom is from 1 to 5 is preferred. Specific examples thereof include trimethylammonium acetate, dimethylpropylammonium acetate, 3-hydroxy-4-trimethylammoniobutyrate, 4-(1-pyridinio)butyrate, 1-hydroxyethyl-1-imidazolioacetate, trimethylammonium methanesulfonate, dimethylpropylammonium methanesulfonate, 3-trimethylammonio-1-propanesulfonate and 3-(1-pyridinio)-1-propanesulfonate.

Since the hydrophilic low molecular weight compound has a small structure of hydrophobic portion and almost no surface active function, degradations of the hydrophobicity and film strength in the image area due to penetration of dampening water into the exposed area (image area) of the image-recording layer are prevented and thus, the ink receptivity and printing durability of the image-recording layer can be preferably maintained.

The amount of the hydrophilic low molecular weight compound added to the image-recording layer is preferably from 0.5 to 20% by weight, more preferably from 1 to 15% by weight, still more preferably from 2 to 10% by weight, based on the total solid content of the image-recording layer. In the range described above, good on-press development property and printing durability are obtained.

The hydrophilic low molecular weight compounds may be used individually or as a mixture of two or more thereof.

(2) Oil-Sensitizing Agent

In order to improve the ink receptivity, an oil-sensitizing agent, for example, a phosphonium compound, a nitrogen-containing low molecular weight compound or an ammonium group-containing polymer can be used in the image-recording layer according to the invention. In particular, in the case where an inorganic stratiform compound is incorporated into a protective layer, the oil-sensitizing agent functions as a surface covering agent of the inorganic stratiform compound and prevents deterioration of the ink receptivity during printing due to the inorganic stratiform compound.

As preferable examples of the phosphonium compound, phosphonium compounds described in JP-A-2006-297907 and JP-A-2007-50660 are exemplified. Specific examples of the phosphonium compound include tetrabutylphosphonium iodide, butyltriphenylphosphonium bromide, tetraphenylphosphonium bromide, 1,4-bis(triphenylphosphonio)butane di(hexafluorophosphate), 1,7-bis(triphenylphosphonio) heptane sulfate and 1,9-bis(triphenylphosphonio)nonane naphthalene-2,7-disulfonate.

As the nitrogen-containing low molecular weight compound, an amine salt and a quaternary ammonium salt are exemplified. Also, an imidazolinium salt, a benzimidazolinium salt, a pyridinium salt and a quinolinium salt are exemplified. Of the nitrogen-containing low molecular weight compounds, the quaternary ammonium salt and pyridinium salt are preferably used. Specific examples the nitrogen-containing low molecular weight compound include tetramethylammonium hexafluorophosphate, tetrabutylammonium hexafluorophosphate, dodecyltrimethylammonium p-toluenesulfonate, benzyltriethylammonium hexafluorophosphate, benzyldimethyloctylammonium hexafluorophosphate, benzyldimethyldodecylammonium hexafluorophosphate and compounds described in Paragraph Nos. [0021] to [0037] of JP-A-2008-284858 and Paragraph Nos. [0030] to [0057] of JP-A-2009-90645.

The ammonium group-containing polymer may be any polymer containing an ammonium group in its structure and is preferably a polymer containing from 5 to 80% by mole of (meth)acrylate having an ammonium group in its side chain as a copolymerization component. Specific examples thereof include polymers described in Paragraph Nos. [0089] to [0105] of JP-A-2009-208458.

As to the ammonium group-containing polymer, its reduced specific viscosity value (unit: ml/g) determined according to the measuring method described hereinafter is preferably in a range from 5 to 120, more preferably in a range from 10 to 110, particularly preferably in a range from 15 to 100. When the reduced specific viscosity value described above is calculated in terms of weight average molecular weight (Mw), from 10,000 to 150,000 is preferred, from 17,000 to 140,000 is more preferred, and 20,000 to 130,000 is particularly preferred.

<Measuring Method of Reduced Specific Viscosity>

In a 20 ml measuring flask was weighed 3.33 g of a 30% by weight polymer solution (1 g as a solid content) and the measuring flask was filled up to the gauge line with N-methylpyrrolidone. The resulting solution was allowed to stand in a thermostatic bath of 30° C. for 30 minutes and put into an Ubbelohde viscometer (viscometer constant: 0.010 cSt/s) and a period for running down of the solution at 30° C. was measured. The measurement was conducted twice for the same sample and an average value of the measurement was determined. The measurement was also conducted for a blank (only N-methylpyrrolidone) in the same manner. The reduced specific viscosity was calculated according to the formula shown below.

$$\text{Reduced specific viscosity (ml/g)} = \frac{\dfrac{\text{Period for running down of sample solution (sec)} - \text{Period for running down of blank (sec)}}{\text{Period for running down of blank (sec)}}}{\dfrac{1.0 \text{ (g)}}{20 \text{ (ml)}}}$$

Specific examples of the ammonium group-containing polymer are set forth below.

(1) 2-(Trimethylammonio)ethyl methacrylate p-toluenesulfonate/3,6-dioxaheptyl methacrylate copolymer (molar ratio: 10/90, Mw: 45,000)

(2) 2-(Trimethylammonio)ethyl methacrylate hexafluorophosphate/3,6-dioxaheptyl methacrylate copolymer (molar ratio: 20/80, Mw: 60,000)

(3) 2-(Ethyldimethylammonio)ethyl methacrylate p-toluenesulfonate/hexyl methacrylate copolymer (molar ratio: 30/70, Mw: 45,000)

(4) 2-(Trimethylammonio)ethyl methacrylate hexafluorophosphate/2-ethylhexyl methacrylate copolymer (molar ratio: 20/80, Mw: 60,000)

(5) 2-(Trimethylammonio)ethyl methacrylate methylsulfate/hexyl methacrylate copolymer (molar ratio: 40/60, Mw: 70,000)

(6) 2-(Butyldimethylammonio)ethyl methacrylate hexafluorophosphate/3,6-dioxaheptyl methacrylate copolymer (molar ratio: 25/75, Mw: 65,000)

(7) 2-(Butyldimethylammonio)ethyl acrylate hexafluorophosphate/3,6-dioxaheptyl methacrylate copolymer (molar ratio: 20/80, Mw: 65,000)

(8) 2-(Butyldimethylammonio)ethyl methacrylate 13-ethyl-5,8,11-trioxa-1-heptadecanesulfonate/3,6-dioxaheptyl methacrylate copolymer (molar ratio: 20/80, Mw: 75,000)

(9) 2-(Butyldimethylammonio)ethyl methacrylate hexafluorophosphate/3,6-dioxaheptyl methacrylate/2-hydroxy-3-methacryloyloxypropyl methacrylate copolymer (molar ratio: 15/80/5, Mw: 65,000)

The content of the oil-sensitizing agent is preferably from 0.01 to 30.0% by weight, more preferably from 0.1 to 15.0% by weight, still more preferably from 1 to 10% by weight, based on the total solid content of the image-recording layer.

(3) Others

Other components, for example, a surfactant, a coloring agent, a print-out agent, a polymerization inhibitor, a higher fatty acid derivative, a plasticizer, an inorganic fine particle, an inorganic stratiform particle, a co-sensitizer or a chain transfer agent may further be added to the image-recording layer. Specifically, compounds and amounts added thereof described, for example, in Paragraph Nos. [0114] to [0159] of JP-A-2008-284817, Paragraph Nos. [0023] to [0027] of JP-A-2006-91479 and Paragraph No. [0060] of U.S. Patent Publication No. 2008/0311520 are preferably used.

(I) Formation of Image-Recording Layer

The image-recording layer according to the invention is formed by dispersing or dissolving each of the necessary components described above in a known solvent to prepare a coating solution and coating the solution on a support by a known method, for example, bar coater coating and drying as described in Paragraph Nos. [0142] to [0143] of JP-A-2008-195018. The coating amount (solid content) of the image-recording layer formed on a support after coating and drying may be varied according to the intended purpose but is in general preferably from 0.3 to 3.0 g/m$^2$. In the range described above, good sensitivity and good film property of the image-recording layer can be obtained.

(Undercoat Layer)

In the lithographic printing plate precursor according to the invention, an undercoat layer (also referred to as an intermediate layer) is preferably provided between the image-recording layer and the support. The undercoat layer strengthens adhesion between the support and the image-recording layer in the exposed area and makes removal of the image-recording layer from the support easy in the unexposed area, thereby contributing improvement in the development property without accompanying degradation of the printing durability. Further, it is advantageous that in the case of infrared laser exposure, since the undercoat layer acts as a heat insulating layer, decrease in sensitivity due to diffusion of heat generated upon the exposure into the support is prevented.

As a compound for use in the undercoat layer, a compound having an adsorbing group capable of adsorbing to a surface of support and a crosslinkable group for improving an adhesion property to the image-recording layer is preferred. Further, a compound having a hydrophilicity-imparting group, for example, a sulfo group is also exemplified as a preferable compound. The compound may be a low molecular weight compound or a polymer compound. The compounds may be used in mixture of two or more thereof, if desired.

As the polymer compound, a copolymer of a monomer having an adsorbing group, a monomer having a hydrophilic group and a monomer having a crosslinkable group is preferred. As the adsorbing group capable of adsorbing to a surface of support, a phenolic hydroxy group, a carboxyl group, —PO$_3$H$_2$, —OPO$_3$H$_2$, —CONHSO$_2$—, —SO$_2$NHSO$_2$— or —COCH$_2$COCH$_3$ is preferred. As the hydrophilic group, a sulfo group is preferred. As the crosslinkable group, for example, a methacryl group or an allyl group is preferred. The polymer compound may contain a crosslinkable group introduced by a salt formation between a polar substituent of the polymer compound and a compound containing a substituent having a counter charge to the polar substituent of the polymer compound and an ethylenically unsaturated bond and may also be further copolymerized with a monomer other than those described above, preferably a hydrophilic monomer.

Specifically, a silane coupling agent having an addition-polymerizable ethylenic double bond reactive group described in JP-A-10-282679 and a phosphorus compound having an ethylenic double bond reactive group described in JP-A-2-304441 are preferably exemplified. Low molecular weight compounds or polymer compounds having a crosslinkable group (preferably an ethylenically unsaturated bond group), a functional group capable of interacting with a surface of support and a hydrophilic group described in JP-A-2005-238816, JP-A-2005-125749, JP-A-2006-239867 and JP-A-2006-215263 are also preferably used.

Polymer compounds having an adsorbing group capable of adsorbing to a surface of support, a hydrophilic group and a crosslinkable group described in JP-A-2005-125749 and JP-A-2006-188038 are more preferred.

The content of the unsaturated double bond in the polymer compound for undercoat layer is preferably from 0.1 to 10.0 mmol, most preferably from 0.2 to 5.5 mmol, based on 1 g of the polymer compound.

The weight average molecular weight of the polymer compound for undercoat layer is preferably 5,000 or more, and more preferably from 10,000 to 300,000.

The undercoat layer according to the invention may contain a chelating agent, a secondary or tertiary amine, a polymerization inhibitor or a compound containing an amino group or a functional group having polymerization inhibition ability and a group capable of interacting with a surface of aluminum support (for example, 1,4-diazabicyclo[2,2,2]octane (DABCO), 2,3,5,6-tetrahydroxy-p-quinone, chloranil, sulfophthalic acid, hydroxyethylethylenediaminetriacetic acid, dihydroxyethylethylenediaminediacetic acid or hydroxyethyliminodiacetic acid) in addition to the compound for the undercoat layer described above in order to prevent the occurrence of stain due to the lapse of time.

The undercoat layer is coated according to a known method. The coating amount (solid content) of the undercoat layer is preferably from 0.1 to 100 mg/m$^2$, and more preferably from 1 to 30 mg/m$^2$.

(Support)

As the support for use in the lithographic printing plate precursor according to the invention, a known support is used. Particularly, an aluminum plate subjected to roughening treatment and anodizing treatment according to a known method is preferred.

Also, an enlarging treatment or a sealing treatment of micropores of the anodized film described in JP-A-2001-253181 and JP-A-2001-322365 or a surface hydrophilizing treatment, for example, with an alkali metal silicate as described in U.S. Pat. Nos. 2,714,066, 3,181,461, 3,280,734 and 3,902,734 or polyvinyl phosphonic acid as described in U.S. Pat. Nos. 3,276,868, 4,153,461 and 4,689,272 may be appropriately selected and applied to the aluminum plate, if desired.

The support preferably has a center line average roughness from 0.10 to 1.2 μm.

The support according to the invention may have a back-coat layer containing an organic polymer compound described in JP-A-5-45885 or an alkoxy compound of silicon described in JP-A-6-35174, provided on the back surface thereof, if desired.

[Plate Making Method]

Plate making of the lithographic printing plate precursor according to the invention is preferably performed by an on-press development method. The on-press development method includes a step in which the lithographic printing plate precursor is imagewise exposed and a printing step in which oily ink and an aqueous component are supplied to the exposed lithographic printing plate precursor without undergoing any development processing to perform printing, and it is characterized in that the unexposed area of the lithographic printing plate precursor is removed in the course of the printing step. The imagewise exposure may be performed on a printing machine after the lithographic printing plate precursor is mounted on the printing machine or may be separately performed using a platesetter or the like. In the latter case, the exposed lithographic printing plate precursor is mounted as it is on a printing machine without undergoing a development processing step. Then, the printing operation is initiated using the printing machine with supplying oily ink and an aqueous component and at an early stage of the printing the on-press development is carried out. Specifically, the image-recording layer in the unexposed area is removed and the hydrophilic surface of support is revealed therewith to form the non-image area. As the oily ink and aqueous component, printing ink and dampening water for conventional lithographic printing can be employed, respectively.

The plate making method is described in more detail below.

As the light source used for the image exposure in the invention, a laser is preferred. Although a laser for use in the invention is not particularly restricted, for example, a solid laser or semiconductor laser emitting an infrared ray having a wavelength from 760 to 1,200 nm is preferably exemplified.

With respect to the infrared ray laser, the output is preferably 100 mW or more, the exposure time per pixel is preferably within 20 microseconds, and the irradiation energy is preferably from 10 to 300 mJ/cm$^2$. With respect to the laser exposure, in order to reduce the exposure time, it is preferred to use a multibeam laser device.

The exposed lithographic printing plate precursor is mounted on a plate cylinder of a printing machine. In case of using a printing machine equipped with a laser exposure apparatus, the lithographic printing plate precursor is mounted on a plate cylinder of the printing machine and then subjected to the imagewise exposure.

When dampening water and printing ink are supplied to the imagewise exposed lithographic printing plate precursor to perform printing, in the exposed area of the image-recording layer, the image-recording layer cured by the exposure forms the printing ink receptive area having the oleophilic surface. On the other hand, in the unexposed area, the uncured image-recording layer is removed by dissolution or dispersion with the dampening water and/or printing ink supplied to reveal the hydrophilic surface in the area. As a result, the dampening water adheres onto the revealed hydrophilic surface and the printing ink adheres onto the exposed area of the image-recording layer, whereby printing is initiated.

While either the dampening water or printing ink may be supplied at first on the surface of lithographic printing plate precursor, it is preferred to supply the printing ink at first in view of preventing the dampening water from contamination with the component of the image-recording layer removed.

Thus, the lithographic printing plate precursor according to the invention is subjected to the on-press development on an offset printing machine and used as it is for printing a large number of sheets.

EXAMPLES

The present invention will be described in more detail with reference to the following examples, but the invention should not be construed as being limited thereto. With respect to the polymer compounds used in the examples, unless otherwise particularly defined, a molecular weight means a weight average molecular weight (Mw) and a ratio of repeating unit is indicated in mole percent.

Examples 1 to 94 and Comparative Examples 1 to 4

[Preparation of Lithographic Printing Plate Precursor]
(1) Preparation of Support An aluminum plate (material: JIS A 1050) having a thickness of 0.3 mm was subjected to a degreasing treatment at 50° C. for 30 seconds using an aqueous 10% by weight sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/cm$^3$) of pumice having a median size of 25 μm, followed by thorough washing with water. The plate was subjected to etching by immersing in an aqueous 25% by weight sodium hydroxide solution of 45° C. for 9 seconds, washed with water, then immersed in an aqueous 20% by weight nitric acid solution at 60° C. for 20 seconds, and washed with water. The etching amount of the grained surface was about 3 g/m$^2$.

Then, using an alternating current of 60 Hz, an electrochemical roughening treatment was continuously carried out on the plate. The electrolytic solution used was an aqueous 1% by weight nitric acid solution (containing 0.5% by weight of aluminum ion) and the temperature of electrolytic solution was 50° C. The electrochemical roughening treatment was conducted using an alternating current source, which provides a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm$^2$ in terms of the peak value of the electric current, and 5% of the electric current flowing from the electric source was divided to the auxiliary anode. The quantity of electricity in the nitric acid electrolysis was 175 C/dm$^2$ in terms of the quantity of electricity when the aluminum plate functioned as an anode. The plate was then washed with water by spraying.

The plate was further subjected to an electrochemical roughening treatment in the same manner as in the nitric acid electrolysis above using as an electrolytic solution, an aqueous 0.5% by weight hydrochloric acid solution (containing 0.5% by weight of aluminum ion) having temperature of 50° C. and under the condition that the quantity of electricity was 50 C/dm$^2$ in terms of the quantity of electricity when the aluminum plate functioned as an anode. The plate was then washed with water by spraying.

The plate was then subjected to an anodizing treatment using as an electrolytic solution, an aqueous 15% by weight sulfuric acid solution (containing 0.5% by weight of aluminum ion) at a current density of 15 A/dm$^2$ to form a direct current anodized film of 2.5 g/m$^2$, washed with water and dried to prepare Support (1).

Thereafter, in order to ensure the hydrophilicity of the non-image area, Support (1) was subjected to silicate treatment using an aqueous 2.5% by weight sodium silicate No. 3 solution at 60° C. for 10 seconds. Subsequently, the plate was washed with water to obtain Support (2). The adhesion amount of Si was 10 mg/m$^2$. The center line average roughness (Ra) of the support was measured using a stylus having a diameter of 2 μm and found to be 0.51 μm.

(2) Formation of Undercoat Layer

Coating solution (1) for undercoat layer shown below was coated on Support (2) so as to have a dry coating amount of 20 mg/m$^2$ to prepare a support having an undercoat layer.

<Coating Solution (1) for Undercoat Layer>

| | |
|---|---|
| Compound (1) for undercoat layer having structure shown below | 0.18 g |
| Hydroxyethyliminodiacetic acid | 0.10 g |
| Methanol | 55.24 g |
| Water | 6.15 g |

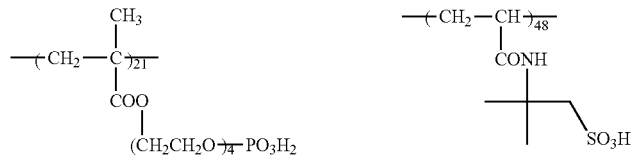

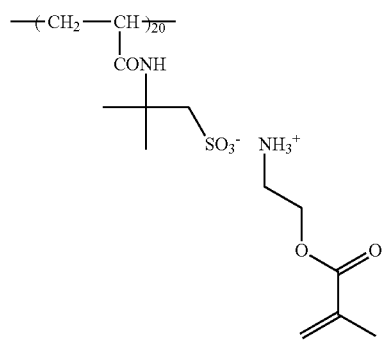

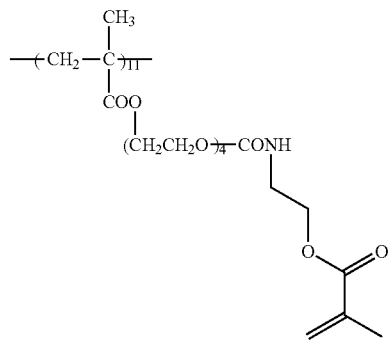

(Mw: 100,000)

Compound (1) for Undercoat Layer (3) Formation of Image-Recording Layer

Coating solution (1) for image-recording layer having the composition shown below was coated on the undercoat layer formed as above by a bar and dried in an oven at 100° C. for 60 seconds to form an image-recording layer having a dry coating amount of 1.0 g/m$^2$.

Coating solution (1) for image-recording layer was prepared by mixing Photosensitive solution (1) shown below with Microgel solution (1) shown below just before the coating, followed by stirring.

<Photosensitive solution (1)>

| | |
|---|---|
| Binder polymer (2) having structure shown below | 0.240 g |
| Infrared absorbing dye (1) having structure shown below | 0.030 g |
| Polymerization initiator (1) having structure shown below | 0.162 g |
| Radical polymerizable compound (Tris(acryloyloxyethyl) isocyanurate (NK ESTER A-9300, produced by Shin-Nakamura Chemical Co., Ltd.)) | 0.192 g |
| Hydrophilic low molecular weight compound (Tris(2-hydroxyethyl) isocyanurate) | 0.062 g |

-continued

| | |
|---|---|
| Hydrophilic low molecular weight compound (1) having structure shown below | 0.050 g |
| Oil-sensitizing agent (Phosphonium compound (1) having structure shown below) | 0.055 g |
| Oil-sensitizing agent (Benzyl dimethyl octyl ammonium PF$_6$ salt) | 0.018 g |
| Oil-sensitizing agent (Ammonium group-containing polymer having structure shown below (reduced specific viscosity: 44 ml/g)) | 0.035 g |
| Fluorine-based surfactant (1) having structure shown below | 0.008 g |
| 2-Butanone | 1.091 g |
| 1-Methoxy-2-propanol | 8.609 g |

<Microgel solution (1)>

| | |
|---|---|
| Microgel (1) shown below | 2.640 g |
| Distilled water | 2.425 g |

The structures of Binder polymer (2), Infrared absorbing dye (1), Polymerization initiator (1), Phosphonium compound (1), Hydrophilic low molecular weight compound (1), Oil-sensitizing agent (ammonium group-containing polymer) and Fluorine-based surfactant (1) are shown below.

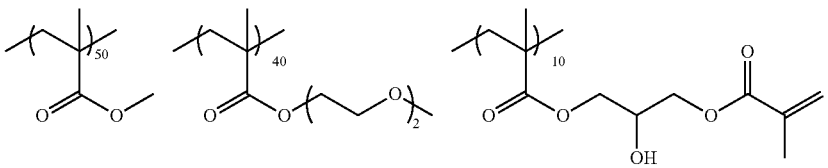

Binder polymer (2) (Mw 70,000)

-continued
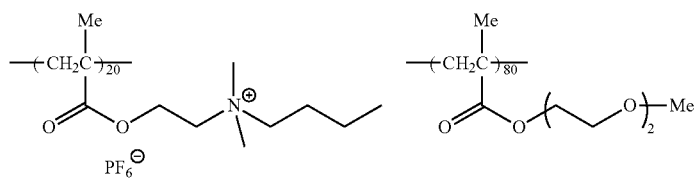
Ammonium group-containing polymer
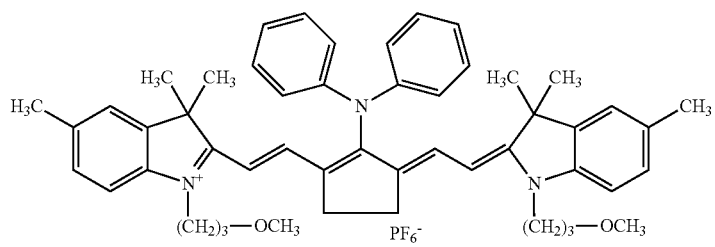
Infrared absorbing dye (1)
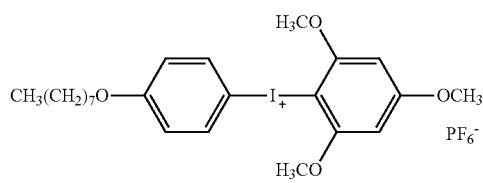
Polymerization initiator (1)
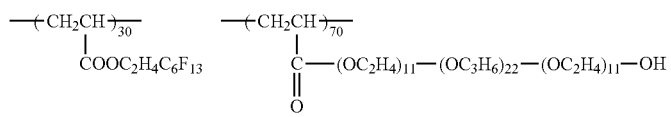
Fluorine-based surfactant (1) (Mw 13,000)
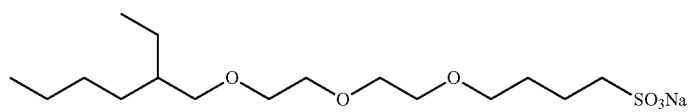
Hydrophilic low molecular weight compound (1)
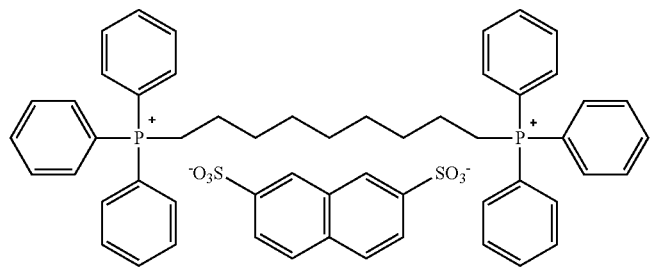
Phosphonium compound (1)

<Preparation of Microgel (1)>

An oil phase component was prepared by dissolving 10 g of adduct of trimethylol propane and xylene diisocyanate (TAKENATE D-110N, produced by Mitsui Chemicals, Inc.), 3.15 g of pentaerythritol triacrylate (SR444, produced by Nippon Kayaku Co., Ltd.) and 0.1 g of alkylbenzenesulfonate (PIONIN A-41C, produced by Takemoto Oil & Fat Co., Ltd.) in 17 g of ethyl acetate. As an aqueous phase component, 40 g of an aqueous 4% by weight solution of polyvinyl alcohol (PVA-205, produced by Kuraray Co., Ltd) was prepared. The oil phase component and the aqueous phase component were mixed and the mixture was emulsified using a homogenizer at 12,000 rpm for 10 minutes. The resulting emulsion was added to 25 g of distilled water and stirred at room temperature for 30 minutes and then at 50° C. for 3 hours. The microgel liquid thus-obtained was diluted using distilled water so as to have the solid content concentration of 15% by weight to prepare Microgel (1). The average particle size of the microgel was measured by a light scattering method and found to be 0.2 μm.

(4) Formation of Protective Layer

Coating solution (1) for protective layer having the composition shown below was coated on the image-recording layer described above by a bar and dried in an oven at 120° C. for 60 seconds to form a protective layer having a dry coating amount of 0.15 g/m$^2$, thereby preparing the lithographic printing plate precursors for Examples 1 to 92 and 94 and Comparative Examples 1 to 4, respectively.

Further, the lithographic printing plate precursor for Example 93 was prepared by forming a protective layer in the same manner as in the lithographic printing plate precursor for Example 4 except for using Coating solution (2) for protective layer having the composition shown below in place of Coating solution (1) for protective layer.

<Coating Solution (1) for Protective Layer>

| | |
|---|---|
| Dispersion of inorganic stratiform compound (1) shown below | 1.5 g |
| Hydrophilic polymer shown in Tables 2 and 3 (solid content) | 0.070 g |
| Aqueous 1% by weight solution of surfactant (polyoxyethylene lauryl ether, EMALEX 710, produced by Nihon Emulsion Co., Ltd.) | 0.86 g |
| Ion-exchanged water | 6.54 g |

(Preparation of Dispersion of Inorganic Stratiform Compound (1))

To 193.6 g of ion-exchanged water was added 6.4 g of synthetic mica (SOMASIF ME-100, produced by CO-OP Chemical Co., Ltd.) and the mixture was dispersed using a homogenizer until an average particle size (according to a laser scattering method) became 3 μm to prepare Dispersion of inorganic stratiform compound (1). The aspect ratio of the inorganic particle thus-dispersed was 100 or more.

<Coating Solution (2) for Protective Layer>

| | |
|---|---|
| Hydrophilic polymer 4 (solid content) | 0.070 g |
| Aqueous 1% by weight solution of surfactant (polyoxyethylene lauryl ether, EMALEX 710, produced by Nihon Emulsion Co., Ltd.) | 0.86 g |
| Ion-exchanged water | 8.00 g |

[II] Evaluation of Lithographic Printing Plate Precursor

Using the lithographic printing plate precursors thus-obtained the on-press development property, ink receptivity (initial ink receptivity and ink receptivity using a specific color ink) and printing durability were evaluated in the manner described below. The ink receptivity using a specific color ink was also evaluated in the case where the lithographic printing plate precursor was preserved.

(1) On-Press Development Property

Each of the lithographic printing plate precursors thus-obtained was exposed by LUXEL PLATESETTER T-6000III equipped with an infrared semiconductor laser, produced by FUJIFILM Corp. under the conditions of a rotational number of an external drum of 1,000 rpm, laser output of 70% and resolution of 2,400 dpi. The exposed image contained a solid image and a 50% halftone dot chart of a 20 μm-dot FM screen.

The exposed lithographic printing plate precursor was mounted without undergoing development processing on a plate cylinder of a printing machine (LITHRONE 26, produced by Komori Corp.). Using dampening water (ECOLITY-2 (produced by FUJIFILM Corp.)/tap water=2/98 (volume ratio)) and VALUES-G (N) Black Ink (produced by DIC Corp.), the dampening water and ink were supplied according to the standard automatic printing start method of LITHRONE 26 to conduct on-press development and printing on 100 sheets of TOKUBISHI Art Paper (76.5 kg) at a printing speed of 10,000 sheets per hour.

A number of the printing papers required until the on-press development of the unexposed area of the image-recording layer on the printing machine was completed to reach a state where the ink was not transferred to the printing paper in the non-image area was measured to evaluate the on-press development property. The results obtained are shown in Tables 2 and 3.

(2) Ink Receptivity i) Initial Ink Receptivity

A number of the printing papers required until ink density on the printing paper corresponding to the exposed region of the image-recording layer reached to the standard density was measured as the initial ink receptivity. The results obtained are shown in Tables 2 and 3.

ii) Ink Receptivity Using Specific Color Ink (Immediately after Preparation and after Preservation)

The exposed lithographic printing plate precursor was mounted without undergoing development processing on a plate cylinder of a printing machine (LITHRONE 26, produced by Komori Corp.). Using dampening water (ECOLITY-2 (produced by FUJIFILM Corp.)/tap water 2/98 (volume ratio)) and EPPLE PANTONE BLAU 072C (produced by Epple AG), the dampening water and ink were supplied according to the standard automatic printing start method of LITHRONE 26 to conduct on-press development and printing on TOKUBISHI Art Paper (76.5 kg) at a printing speed of 10,000 sheets per hour. The 10,000$^{th}$ printing paper was sampled and an ink density of the 20% halftone dot of FM screen was measured using a Gretag densitometer. Based on the measured value, the ink receptivity was evaluated according the criterion shown below. The results obtained are shown in Tables 2 and 3.

A: Ink density from 1.8 to 1.9. The ink density did not decrease at all and good ink receptivity was exhibited.

B: Ink density from 1.5 to 1.7. The ink density somewhat decreased but it was at an acceptable level.
C: Ink density from 1.0 to 1.4. The ink density clearly decreased and it was an unacceptable level.
D: Ink density of 0.9 or less. The ink density severely decreased and the ink receptivity was bad.

The result of the ink receptivity after preservation was obtained by after preserving the lithographic printing plate precursor at 60° C. for 4 days and conducting the evaluation described above.

(3) Printing Durability

After performing the evaluation for the on-press development property of the lithographic printing plate precursor immediately after the preparation described above, the printing was continued. As the increase in a number of printing papers, the image-recording layer was gradually abraded to cause decrease in the ink density on a printed material. A number of printed materials wherein a value obtained by measuring a halftone dot area rate of the 50% halftone dot of FM screen on the printed material using a Gretag densitometer decreased by 5% from the value measured on the 100$^{th}$ paper of the printing was determined to evaluate the printing durability. The results obtained are shown in Tables 2 and 3.

TABLE 2

Examples 1 to 41

| | Number of Hydrophilic Polymer | Initial Ink Receptivity (sheets) | Ink Receptivity using Specific Color Ink Immediately after Preparation | Ink Receptivity using Specific Color Ink After Preservation | On-press Development Property (sheets) | Printing Durability (×10$^4$ sheets) |
|---|---|---|---|---|---|---|
| Example 1  | 1  | 20 | B | B | 10 | 5 |
| Example 2  | 2  | 15 | A | A | 13 | 5 |
| Example 3  | 3  | 15 | A | A | 10 | 5 |
| Example 4  | 4  | 15 | A | A | 10 | 5 |
| Example 5  | 5  | 15 | A | A | 15 | 5 |
| Example 6  | 6  | 20 | B | B | 10 | 5 |
| Example 7  | 7  | 15 | A | A | 13 | 5 |
| Example 8  | 8  | 15 | A | A | 10 | 5 |
| Example 9  | 9  | 15 | A | A | 10 | 5 |
| Example 10 | 10 | 15 | A | A | 15 | 5 |
| Example 11 | 11 | 20 | B | B | 10 | 5 |
| Example 12 | 12 | 15 | A | A | 13 | 5 |
| Example 13 | 13 | 15 | A | A | 10 | 5 |
| Example 14 | 14 | 15 | A | A | 10 | 5 |
| Example 15 | 15 | 15 | A | A | 15 | 5 |
| Example 16 | 16 | 15 | A | A | 15 | 5 |
| Example 17 | 17 | 20 | B | B | 10 | 5 |
| Example 18 | 18 | 15 | A | A | 15 | 5 |
| Example 19 | 19 | 15 | A | A | 15 | 5 |
| Example 20 | 20 | 15 | A | A | 15 | 5 |
| Example 21 | 21 | 15 | A | A | 15 | 5 |
| Example 22 | 22 | 15 | A | A | 15 | 5 |
| Example 23 | 23 | 15 | A | A | 15 | 5 |
| Example 24 | 24 | 15 | A | A | 15 | 5 |
| Example 25 | 25 | 15 | A | A | 10 | 5 |
| Example 26 | 26 | 15 | A | A | 10 | 5 |
| Example 27 | 27 | 15 | A | A | 15 | 5 |
| Example 28 | 28 | 15 | A | A | 15 | 5 |
| Example 29 | 29 | 15 | A | A | 15 | 5 |
| Example 30 | 30 | 15 | A | A | 15 | 5 |
| Example 31 | 31 | 15 | A | A | 15 | 5 |
| Example 32 | 32 | 15 | A | A | 15 | 5 |
| Example 33 | 33 | 15 | A | A | 15 | 5 |
| Example 34 | 34 | 15 | A | A | 10 | 5 |
| Example 35 | 35 | 15 | A | A | 15 | 5 |
| Example 36 | 36 | 15 | A | A | 10 | 5 |
| Example 37 | 37 | 15 | A | A | 10 | 5 |
| Example 38 | 38 | 15 | A | A | 15 | 5 |
| Example 39 | 39 | 15 | A | A | 10 | 5 |
| Example 40 | 40 | 15 | A | A | 13 | 5 |
| Example 41 | 41 | 15 | A | A | 13 | 5 |

TABLE 3

Examples 42 to 94 and Comparative Examples 1 to 4

| | Number of Hydrophilic Polymer | Initial Ink Receptivity (sheets) | Ink Receptivity using Specific Color Ink | | On-press Development Property (sheets) | Printing Durability ($\times 10^4$ sheets) |
|---|---|---|---|---|---|---|
| | | | Immediately after Preparation | After Preservation | | |
| Example 42 | 42 | 15 | A | A | 15 | 5 |
| Example 43 | 43 | 15 | A | A | 15 | 5 |
| Example 44 | 44 | 15 | A | A | 10 | 5 |
| Example 45 | 45 | 15 | A | A | 15 | 5 |
| Example 46 | 46 | 15 | A | A | 10 | 5 |
| Example 47 | 47 | 15 | A | A | 10 | 5 |
| Example 48 | 48 | 15 | A | A | 15 | 5 |
| Example 49 | 49 | 15 | A | A | 10 | 5 |
| Example 50 | 50 | 15 | A | A | 13 | 5 |
| Example 51 | 51 | 15 | A | A | 13 | 5 |
| Example 52 | 52 | 15 | A | A | 15 | 5 |
| Example 53 | 53 | 17 | B | B | 10 | 5 |
| Example 54 | 54 | 17 | B | B | 10 | 5 |
| Example 55 | 55 | 15 | A | A | 10 | 5 |
| Example 56 | 56 | 15 | A | A | 10 | 5 |
| Example 57 | 57 | 15 | A | A | 13 | 5 |
| Example 58 | 58 | 17 | B | B | 10 | 5 |
| Example 59 | 59 | 17 | B | B | 10 | 5 |
| Example 60 | 60 | 15 | A | A | 10 | 5 |
| Example 61 | 61 | 15 | A | A | 10 | 5 |
| Example 62 | 62 | 15 | A | A | 13 | 5 |
| Example 63 | 63 | 15 | A | A | 15 | 5 |
| Example 64 | 64 | 15 | A | A | 13 | 5 |
| Example 65 | 65 | 15 | A | A | 13 | 5 |
| Example 66 | 66 | 15 | A | A | 10 | 5 |
| Example 67 | 67 | 15 | A | A | 10 | 5 |
| Example 68 | 68 | 15 | A | A | 15 | 5 |
| Example 69 | 69 | 15 | A | A | 13 | 5 |
| Example 70 | 70 | 15 | A | A | 13 | 5 |
| Example 71 | 71 | 15 | A | A | 10 | 5 |
| Example 72 | 72 | 15 | A | A | 10 | 5 |
| Example 73 | 73 | 15 | A | A | 10 | 5 |
| Example 74 | 74 | 15 | A | A | 10 | 5 |
| Example 75 | 75 | 15 | A | A | 10 | 5 |
| Example 76 | 76 | 15 | A | B | 10 | 5 |
| Example 77 | 77 | 15 | A | B | 10 | 5 |
| Example 78 | 78 | 15 | A | A | 10 | 5 |
| Example 79 | 79 | 15 | A | A | 10 | 5 |
| Example 80 | 80 | 15 | A | A | 10 | 5 |
| Example 81 | 81 | 15 | A | B | 10 | 5 |
| Example 82 | 82 | 15 | A | B | 10 | 5 |
| Example 83 | 83 | 15 | A | A | 10 | 5 |
| Example 84 | 84 | 15 | A | A | 10 | 5 |
| Example 85 | 85 | 15 | A | A | 10 | 5 |
| Example 86 | 86 | 15 | A | B | 10 | 5 |
| Example 87 | 87 | 15 | A | B | 10 | 5 |
| Example 88 | 88 | 15 | A | A | 10 | 5 |
| Example 89 | 89 | 15 | A | A | 10 | 5 |
| Example 90 | 90 | 15 | A | A | 10 | 5 |
| Example 91 | 91 | 15 | A | B | 10 | 5 |
| Example 92 | 92 | 15 | A | B | 10 | 5 |
| Example 93 | 4 | 17 | B | B | 17 | 3 |
| Example 94 | 94 | 15 | A | A | 10 | 5 |
| Comparative Example1 | 95 for Comparison | 15 | A | A | 20 | 5 |
| Comparative Example 2 | 96 for Comparison | 15 | A | A | 20 | 5 |
| Comparative Example 3 | 97 for Comparison | 15 | B | C | 10 | 5 |
| Comparative Example 4 | 98 for Comparison | 15 | D | D | 10 | 5 |

Hydrophilic Polymers Used in Comparative Examples (95 to 98 for Comparison)

TABLE 4

Hydrophilic Polymer for Comparison

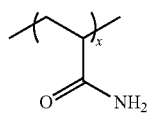

95

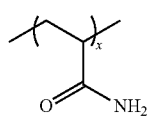

96-98

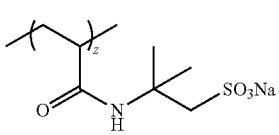

| Number of Hydrophilic Polymer | Composition Ratio (% by mole) | | | Mw |
|---|---|---|---|---|
| | x | y | z | |
| 95 for Comparison | 75 | 25 | 0 | 20,000 |
| 96 for Comparison | 74.8 | 25 | 0.2 | 20,000 |
| 97 for Comparison | 69.9 | 25 | 5.1 | 20,000 |
| 98 for Comparison | 55 | 25 | 20 | 20,000 |

What is claimed is:

1. A lithographic printing plate precursor comprising, in the following order:
    a support;
    an image-recording layer which is capable of forming an image by removing an unexposed area of the image-recording layer with at least one of printing ink and dampening water on a printing machine after exposure and contains an infrared absorbing dye, a polymerization initiator, a polymerizable compound and a binder polymer having an alkylene oxide group; and
    a protective layer containing a hydrophilic polymer which contains at least a repeating unit represented by the following formula (1), a repeating unit represented by the following formula (2) and a repeating unit represented by the following formula (4) and in which a content of the repeating unit represented by the formula (4) is from 0.3 to 5.0% by mole based on total repeating units of the hydrophilic polymer:

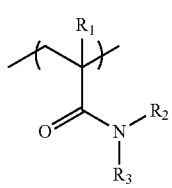

Formula (1)

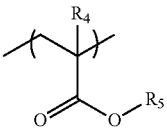

Formula (2)

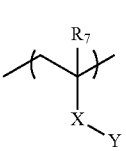

Formula (4)

wherein, in the formulae (1), (2) and (4), $R_1$, $R_4$ and $R_7$ each independently represents a hydrogen atom or a methyl group, $R_2$ and $R_3$, which may be the same or different, each represents a hydrogen atom, a methyl group or an ethyl group, and $R_5$ represents an alkyl group having from 2 to 10 carbon atoms;
    in the formula (4), X represents a single bond, a divalent connecting chain selected from structures of the following Structural Group (5) or a divalent connecting chain formed by a combination of two or more structures of the Structural Group (5), and Y represents a carboxylic acid group, a carboxylate group, a sulfonic acid group, a sulfonate group, a phosphoric acid group, a phosphate group, a phosphonic acid group, a phosphonate group, a hydroxy group, a carboxybetaine group, a sulfobetaine group, an ammonium group or a polyether group represented by the following formula (3); and
    in the formula (3), L represents an alkylene group having from 2 to 6 carbon atoms, $R_6$ represents an alkyl group having from 4 to 8 carbon atoms, and n is an average addition molar number of polyether and represents a number of from 2 to 4:

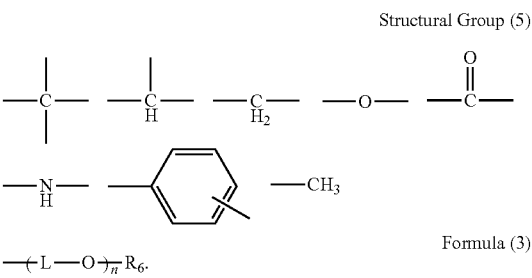

Structural Group (5)

Formula (3)

2. The lithographic printing plate precursor as claimed in claim 1, wherein $R_2$ and $R_3$ in the repeating unit represented by the formula (1) each represent a hydrogen atom and $R_5$ in the repeating unit represented by the formula (2) represents an unsubstituted straight-chain, branched or cyclic alkyl group having from 2 to 8 carbon atoms.

3. The lithographic printing plate precursor as claimed in claim 1, wherein Y in the formula (4) represents a sulfonic acid group, a sulfonate group, a carboxybetaine group, a sulfobetaine group or an ammonium group.

4. The lithographic printing plate precursor as claimed in claim 2, wherein Y in the formula (4) represents a sulfonic acid group, a sulfonate group, a carboxybetaine group, a sulfobetaine group or an ammonium group.

5. The lithographic printing plate precursor as claimed in claim 1, wherein X in the formula (4) contains one of the following connecting chains:

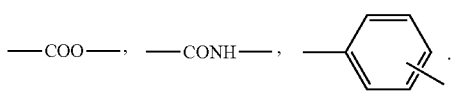

6. The lithographic printing plate precursor as claimed in claim 2, wherein X in the formula (4) contains one of the following connecting chains:

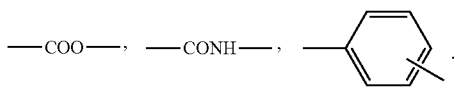

7. The lithographic printing plate precursor as claimed in claim 3, wherein X in the formula (4) contains one of the following connecting chains:

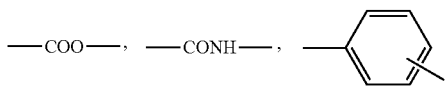

8. The lithographic printing plate precursor as claimed in claim 4, wherein X in the formula (4) contains one of the following connecting chains:

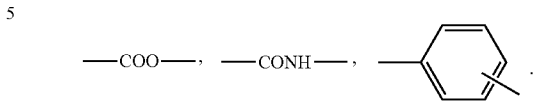

9. The lithographic printing plate precursor as claimed in claim 1, wherein the protective layer contains an inorganic stratiform compound.

10. The lithographic printing plate precursor as claimed in claim 1, wherein the image-recording layer further contains a hydrophobilizing precursor.

11. A plate making method of a lithographic printing plate precursor comprising:
 exposing imagewise the lithographic printing plate precursor as claimed in claim 1; and
 removing an unexposed area of the image-recording layer of the exposed lithographic printing plate precursor by supplying at least one of printing ink and dampening water to the exposed lithographic printing plate precursor mounted on a printing machine.

* * * * *